United States Patent
Bahr et al.

(10) Patent No.: US 10,084,426 B2
(45) Date of Patent: Sep. 25, 2018

(54) APPARATUS, SYSTEMS, AND METHODS OF ACOUSTIC ENERGY CONFINEMENT WITH PHONONIC CRYSTALS

(71) Applicant: Massachusetts Institute of Technology, Cambridge, MA (US)

(72) Inventors: Bichoy W. Bahr, Richardson, TX (US); Dana Weinstein, West Lafayette, IN (US)

(73) Assignee: MASSACHUSETTS INSTITUTE OF TECHNOLOGY, Cambridge, MA (US)

( * ) Notice: Subject to any disclaimer, the term of this patent is extended or adjusted under 35 U.S.C. 154(b) by 0 days.

(21) Appl. No.: 15/695,523

(22) Filed: Sep. 5, 2017

(65) Prior Publication Data
US 2018/0013398 A1    Jan. 11, 2018

Related U.S. Application Data

(63) Continuation of application No. PCT/US2016/066971, filed on Dec. 15, 2016.

(60) Provisional application No. 62/267,407, filed on Dec. 15, 2015.

(51) Int. Cl.
| | |
|---|---|
| *H03H 9/02* | (2006.01) |
| *H01L 41/09* | (2006.01) |
| *H01P 3/08* | (2006.01) |
| *H03H 9/17* | (2006.01) |

(52) U.S. Cl.
CPC ......... *H03H 9/02244* (2013.01); *H01L 41/09* (2013.01); *H01P 3/08* (2013.01); *H03H 9/17* (2013.01)

(58) Field of Classification Search
CPC ........ H01P 3/08; H03H 9/02244; H03H 9/17; H01L 41/096
See application file for complete search history.

(56) References Cited

U.S. PATENT DOCUMENTS

| | | | |
|---|---|---|---|
| 8,054,145 B2 * | 11/2011 | Mohammadi | H01L 41/107 333/186 |
| 9,673,376 B1 * | 6/2017 | Krivokapic | H01L 41/0474 |
| 2011/0128094 A1 | 6/2011 | Huang et al. | |

(Continued)

OTHER PUBLICATIONS

Bahr, Bichoy et al., "Theory and Design of Phononic Crystals for Unreleased CMOS-MEMS Resonant Body Transistors," *Journal of Microelectromechanical Systems*, vol. 24, No. 5 (Oct. 2015): 1520-1531.

(Continued)

*Primary Examiner* — J. San Martin
(74) *Attorney, Agent, or Firm* — Smith Baluch LLP

(57) ABSTRACT

An acoustic resonator includes a wafer and a first phononic crystal disposed on the wafer to define an acoustic waveguide so as to propagate an acoustic wave along a propagation direction. The first phononic crystal includes a first two-dimensional (2D) array of metal stripes having a first period on the propagation direction. The apparatus also includes a second phononic crystal and a third phononic crystal disposed on two sides of the first phononic crystal and having a different period from the first period. The second phononic crystal and the wafer define a first reflector to reflect the acoustic wave. The third phononic crystal and the wafer define a second reflector to reflect the acoustic wave.

22 Claims, 30 Drawing Sheets

(56) References Cited

U.S. PATENT DOCUMENTS

2013/0214878 A1  8/2013 Gorisse et al.
2015/0237423 A1  8/2015 Bahr et al.

OTHER PUBLICATIONS

International Search Report and Written Opinion dated Mar. 10, 2017 for International Application No. PCT/US16/66971, 12 pages.
Marathe, R. et al., "Resonant Body Transistors in IBM's 32 nm SOI CMOS Technology," Journal of Microelectromechanical Systems, vol. 23, No. 3, Jun. 2014.
Wang, S. et al., "Tapered Phononic Crystal Saw Resonator in GaN," in Micro Electro Mechanical Systems (MEMS), 2015 28th IEEE International Conference on, vol., No., pp. 1028-1031, Jan. 18-22, 2015.
Wang, W. et al., "Acoustic Bragg Reflectors for Q Enhancement of Unreleased MEMS Resonators," in Frequency Control and the European Frequency and Time Forum (FCS), 2011 Joint Conference of the IEEE International, vol., No., pp. 1-6, May 2-5, 2011.

* cited by examiner

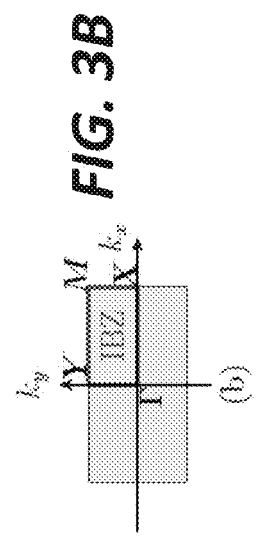
*FIG. 3A*
*FIG. 3B*
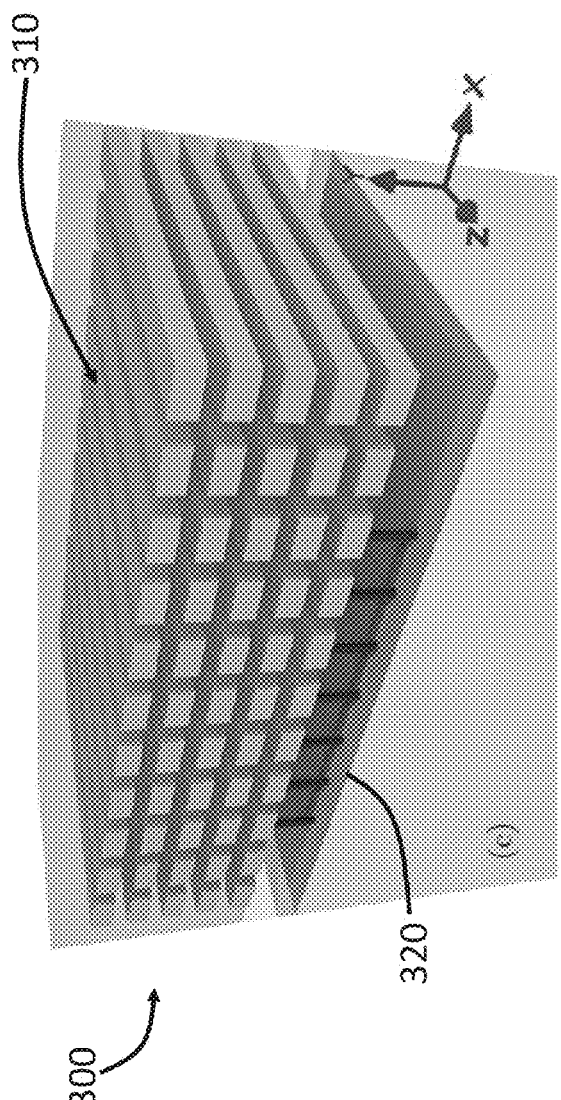
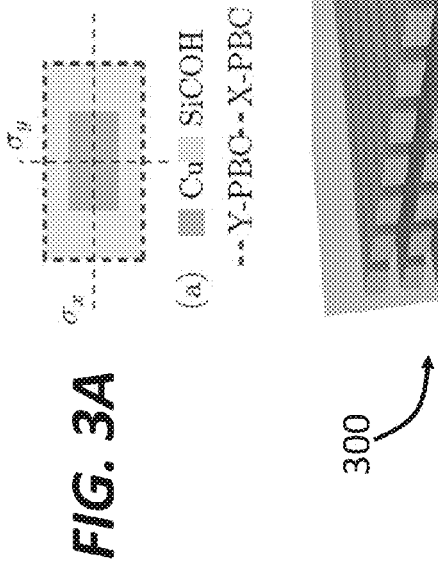
*FIG. 3C*

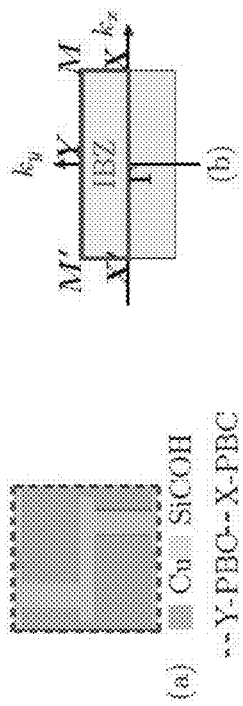
*FIG. 6A*
*FIG. 6B*
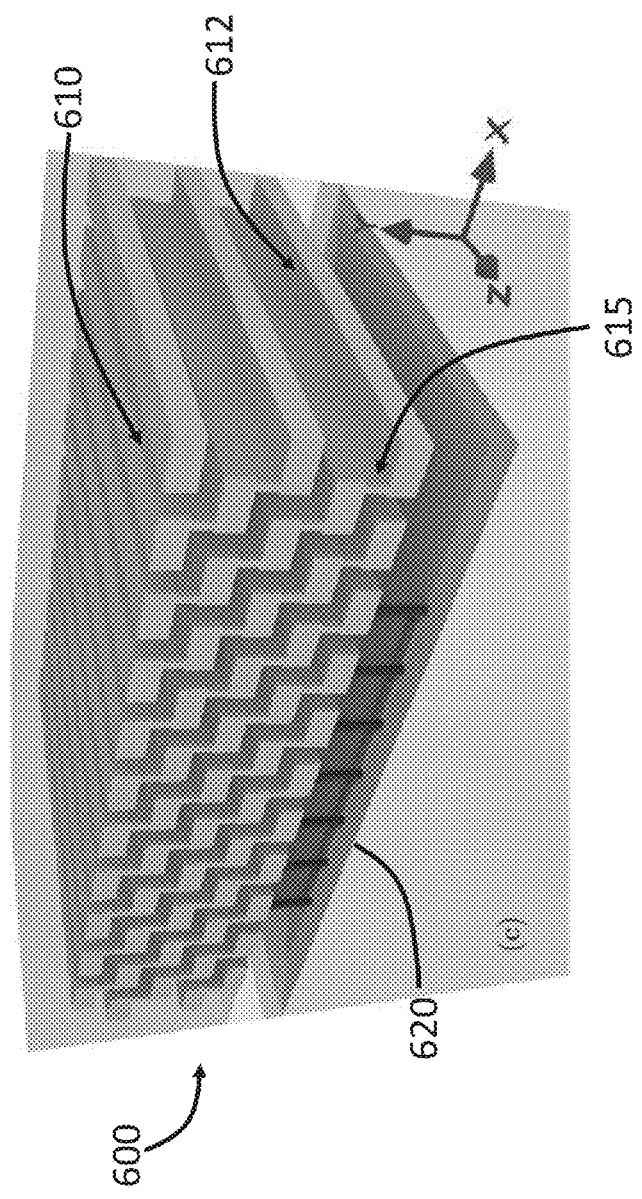
*FIG. 6C*

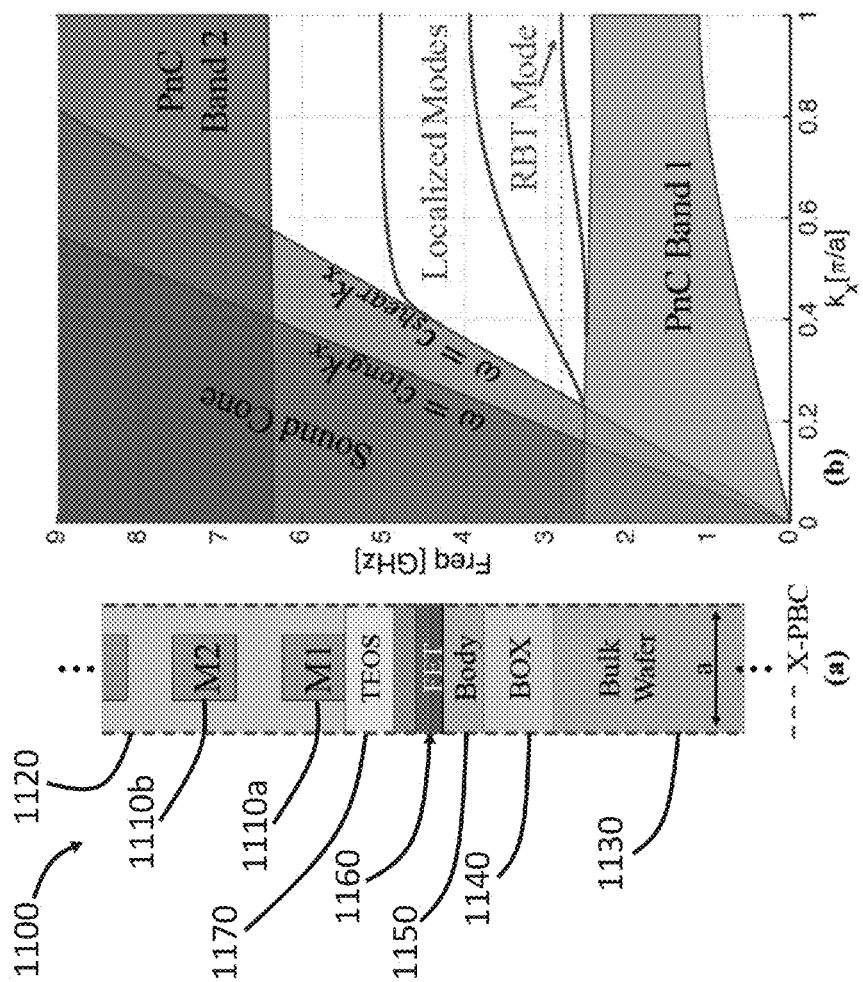

APPARATUS, SYSTEMS, AND METHODS OF ACOUSTIC ENERGY CONFINEMENT WITH PHONONIC CRYSTALS

CROSS-REFERENCES TO RELATED APPLICATIONS

This application claims a priority benefit to PCT Application No. PCT/US2016/066971, filed Dec. 15, 2016, entitled "APPARATUS, SYSTEMS, AND METHODS OF ACOUSTIC ENERGY CONFINEMENT WITH PHONONIC CRYSTALS", which is hereby incorporated by reference in its entirety. PCT Application No. PCT/US2016/066971 in turn claims priority to U.S. Application No. 62/267,407, filed Dec. 15, 2015, entitled "PHONONIC CRYSTALS WITH ADIABATIC TRANSITIONS FOR FULL ACOUSTIC CONFINEMENT IN MEMS RESONATORS," which is hereby incorporated herein by reference in their entirety for all purposes.

GOVERNMENT SUPPORT

This invention was made with Government support under Contract No. HR0011-13-C-0052 awarded by the Defense Advanced Research Projects Agency. The Government has certain rights in the invention.

BACKGROUND

Digital electronics including digital and radio frequency (RF) communication circuits are becoming increasingly more ubiquitous in modern life. Many digital and RF communication circuits rely on high-quality frequency sources, or oscillators. For example, oscillators can provide a clock for digital circuits and act as a local oscillator in RF communication systems.

A high purity oscillator typically includes a high quality factor (Q) sharp filter. A higher Q can lead to lower noise in the oscillator and/or power consumption. Filters are also used as standalone components in RF systems to select different frequency bands and channels.

Filters based on mechanical resonance usually have higher quality factors than those of electrical filters. For example, piezoelectric quartz crystals, which can have quality factors greater than 100000 and reasonable frequency stability, are a good example of mechanical filters that dominated oscillators for decades. However, miniaturization and integration of quartz crystals in standard IC technology, specifically complementary metal-oxide-semiconductor (CMOS), can be challenging. Furthermore, quartz crystals are typically bulky, thereby consuming extra space on a system board along with dedicated pins for the integrated circuit. The oscillation frequencies of quartz crystals are typically in the MHz range (e.g., $f_0$<300 MHz). As a result, a phase-locked-loop (PLL) is usually employed in order to generate GHz frequency signals, thereby complicating the system and increasing power consumption.

On-chip electrical L-C tank circuits can be an alternative to mechanical filters for scaling to GHz frequencies. However, the resulting quality factor is usually very low (e.g., Q<30) and it can be challenging to control the resonance frequency due to substantial CMOS process variations. They also tend to consume large on-chip prime die area (e.g., about 100×100 $\mu m^2$), thereby increasing the size and cost of the CMOS die and accordingly the cost of the overall system.

Micro-electro-mechanical systems (MEMS) resonators are potential candidates to satisfy today's technological demands. MEMS resonators can span a wide frequency range from about 100 kHz to over 10 GHz. They can achieve quality factors exceeding $10^4$, within a footprint that is about 1000 times smaller than that of on-chip L-C tank circuits. Finally, they have the potential for monolithic integration with commercial CMOS IC technologies.

To fully explore the capabilities of MEMS resonators, there remain a few challenges. First, fabrication of most traditional MEMS resonators includes a release step. More specifically, sacrificial layers are included during the micromachining of MEMS resonators and then etched away to create the freely suspended and vibrating structure for resonators and inertial sensors. The release operation can dramatically affect the process yield.

Second, as mechanical devices, MEMS resonators typically have free surfaces that vibrate and move. As a result, MEMS resonators can be sensitive to ambient pressure and humidity adsorption, as well as particle deposition. These factors can directly affect the quality factor and the resonance frequency of the resonators. In addition, some MEMS resonators include air gaps for electrostatic actuation. These MEMS devices are then usually hermetically sealed and protected from the environment to avoid degradation of the device performance. The sealing can be specialized and costly, thereby increasing the overall system size, complexity, and cost.

Third, true monolithic integration of MEMS resonators with CMOS circuits have been a challenge so far. Integration techniques usually include extensive post-processing or complicated protection at different stages of the fabrication process. Process thermal budget and yield optimization can be major issues for these processes.

SUMMARY

The Inventors have recognized and appreciated that the ability to integrate high-Q filters with other components of integrated circuits (ICs) in a compact form factor and low power solution would benefit virtually every device that relies on digital circuits or RF data links. Accordingly, in view of the various challenges discussed above in connection with conventional implementations of electrical and mechanical resonators, inventive implementations of acoustic resonators, described in greater detail below, relate to the use of phononic crystals fabricated on silicon wafers. In one aspect, such acoustic resonators may be fabricated using conventional CMOS process technologies to facilitate ease of implementation and ready adoption in established semiconductor fabrication foundries, with corresponding high yields. In another aspect, the ability to fabricate acoustic resonators using conventional process technologies facilitates integration of such resonators with other components of CMOS ICs to realize compact form factors and low power solutions.

In one example, an apparatus for confining an acoustic wave includes a wafer and a first phononic crystal disposed on the wafer. The first phononic crystal and the wafer define an acoustic waveguide to propagate the acoustic wave along a propagation direction. The first phononic crystal includes a first two-dimensional (2D) array of metal stripes having a first period on the propagation direction. The apparatus also includes a second phononic crystal disposed on a first side of the first phononic crystal. The second phononic crystal includes a second 2D array of metal stripes having a second period, different than the first period, along the propagation direction. The second phononic crystal and the wafer define a first reflector to reflect the acoustic wave. The apparatus also includes a third phononic crystal disposed on a second side, opposite the first side, of the first phononic crystal. The third phononic crystal includes a third 2D array of metal stripes having a third period, different than the first period, along the propagation direction. The third phononic crystal and the wafer define a second reflector to reflect the acoustic wave.

In another example, a method of confining an acoustic wave includes guiding the acoustic wave along a propagation direction in a waveguide defined by a wafer and a first phononic crystal disposed on the wafer. The first phononic crystal includes a first two-dimensional (2D) array of metal stripes having a first period along the propagation direction. The method also includes reflecting the acoustic wave by a first reflector defined by the wafer and a second phononic crystal disposed on a first side of the first phononic crystal. The second phononic crystal includes a second 2D array of metal stripes having a second period, different than the first period, along the propagation direction. The method further includes reflecting the acoustic by a second reflector defined by the wafer and a third phononic crystal disposed on a second side, opposite the first side, of the first photonic crystal. The third phononic crystal includes a third 2D array of metal stripes having a third period, different than the first period, along the propagation direction.

In yet another example, an acoustic resonator includes a silicon wafer and a first phononic crystal disposed on the silicon wafer. The first phononic crystal and the wafer define an acoustic waveguide to propagate the acoustic wave along a propagation direction. The first phononic crystal includes a first two-dimensional (2D) array of metal stripes having a first period along the propagation direction. The apparatus also includes a second phononic crystal disposed on a first side of the first phononic crystal and including a second 2D array of metal stripes having a second period, different than the first period, along the propagation direction. The second phononic crystal and the silicon wafer define a first reflector to reflect the acoustic wave. The apparatus also includes a first transition region disposed between the first 2D array of metal stripes and the second 2D array of metal stripes. Spacing between adjacent metal stripes in the first transition region changes monotonically from the first period to the second period along the propagation direction. The apparatus also includes a third phononic crystal disposed on a second side, opposite the first side, of the first phononic crystal. The third phononic crystal includes a third 2D array of metal stripes having a third period, different than the first period, along the propagation direction. The third phononic crystal and the wafer define a second reflector to reflect the acoustic wave. The apparatus also includes a second transition region disposed between the first 2D array of metal stripes and the third 2D array of metal stripes. Spacing between the adjacent metal stripes in the second transition region changes monotonically from the first period to the third period along the propagation direction. The apparatus also includes an array of field effect transistors (FETs), disposed between the first photonic crystal and the silicon wafer and having a FET period substantially equal to the first period, to generate the acoustic wave. Adjacent FETs in the array of FETs are configured to generate acoustic signals having opposite phases.

It should be appreciated that all combinations of the foregoing concepts and additional concepts discussed in greater detail below (provided such concepts are not mutually inconsistent) are contemplated as being part of the inventive subject matter disclosed herein. In particular, all combinations of claimed subject matter appearing at the end of this disclosure are contemplated as being part of the inventive subject matter disclosed herein. It should also be appreciated that terminology explicitly employed herein that also may appear in any disclosure incorporated by reference should be accorded a meaning most consistent with the particular concepts disclosed herein.

BRIEF DESCRIPTION OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIGS. 3A-3C illustrate a phononic crystal including parallel and periodic rectangular metal lines that can be used in the resonators shown in FIGS. 1-2.

FIGS. 6A-6C illustrate a phononic crystal including z-shaped unit cells that can be used in the resonator shown in FIGS. 1-2.

FIG. 10 shows a cross section of a phononic crystal cell that can define an acoustic waveguide.

FIG. 11 shows calculated dispersion relation of the phononic crystal shown in FIG. 10.

DETAILED DESCRIPTION

Figure 1:
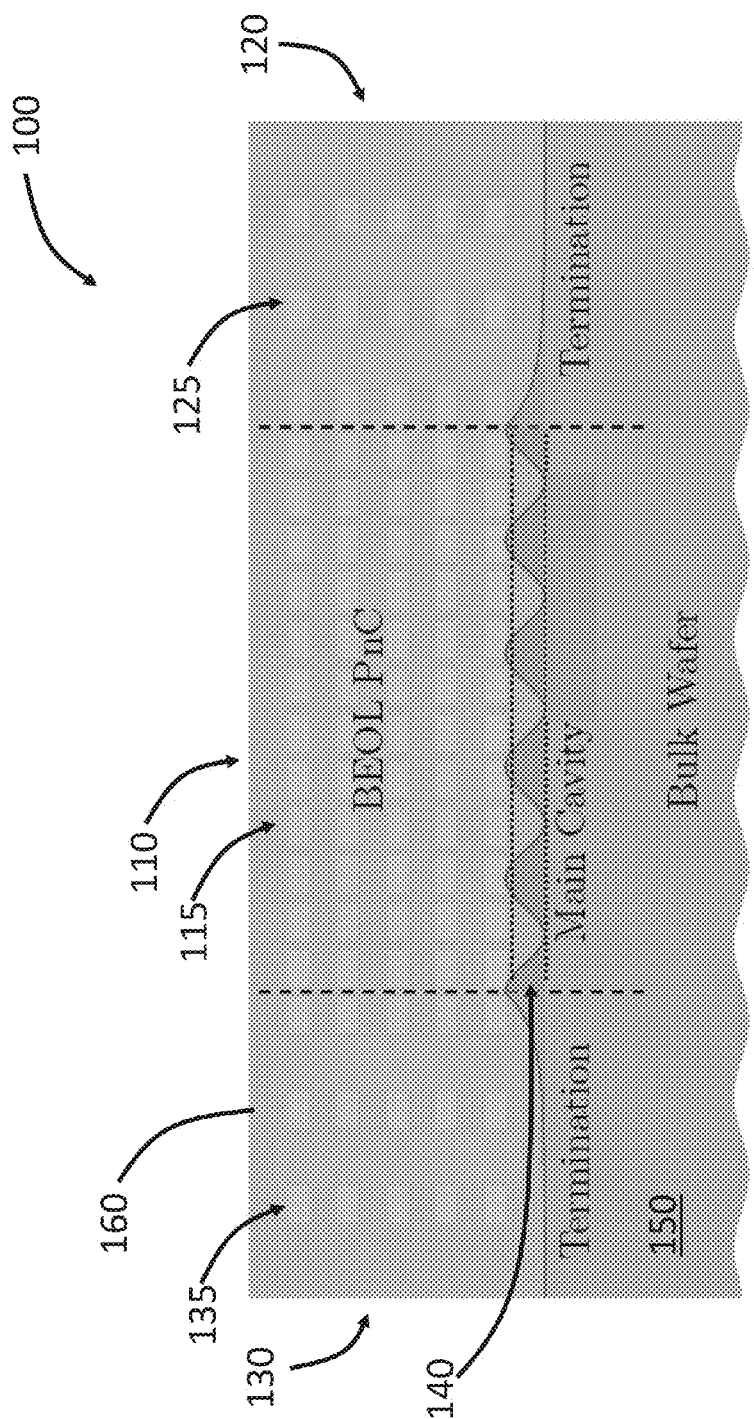
FIG. 1 shows a schematic of an acoustic resonator including phononic crystals.

Following below are more detailed descriptions of various concepts related to, and embodiments of, inventive systems, methods and apparatus for acoustic energy confinement with phononic crystals. It should be appreciated that various concepts introduced above and discussed in greater detail below may be implemented in any of numerous ways, as the disclosed concepts are not limited to any particular manner of implementation. Examples of specific implementations and applications are provided primarily for illustrative purposes.

Overview

To address the challenges in conventional mechanical resonators (including MEMS acoustic resonators) and facilitate integration of resonators with other components of ICs, the inventive apparatus, systems, and methods described herein employ phononic crystals to confine acoustic energy. In exemplary implementations, the confinement of acoustic energy is achieved by the combination of vertical confinement and horizontal confinement of acoustic energy within a semiconductor structure on a silicon wafer so as to readily facilitate integration of the resonator with other semiconductor components. In one aspect, such acoustic resonators may be fabricated using conventional CMOS fabrication process technologies (e.g., without requiring any substantive changes to existing methodologies for fabrication of CMOS ICs).

In the vertical direction of such a semiconductor structure (e.g., in a direction normal to the plane of the silicon wafer), an acoustic waveguide is defined in the space between a phononic crystal fabricated on a silicon substrate or "bulk wafer" and the bulk wafer itself. The phononic crystal is characterized by a bandgap in its dispersion diagram. Acoustic modes in the bandgap do not propagate in the phononic crystal. The bulk wafer is characterized by a sound cone, and acoustic modes with component $k_x > \omega/c$ (where $k_x$ is the wave vector component along the horizontal direction, $\omega$ is the wave angular frequency, and c is the speed of sound in the bulk wafer) cannot propagate into the bulk wafer. As a result, acoustic modes that are within the bandgap of the phononic crystal and outside the sound cone of the bulk wafer would be reflected by the phononic crystal on one end and reflected by the bulk wafer on the other end. In other words, these acoustic modes can only propagate in the space between the phononic crystal and the bulk wafer, thereby defining an acoustic waveguide in the vertical direction.

In general, each acoustic waveguide as described above allows certain acoustic modes (referred to as allowed modes) to propagate thorough. Acoustic modes that are not allowed in an acoustic waveguide are therefore reflected by the acoustic waveguide upon incidence on the waveguide.

With the foregoing in mind, horizontal confinement of acoustic energy in the semiconductor structures described herein (e.g., in a direction along the plane of the silicon wafer) can be achieved by placing one acoustic waveguide (also referred to as the "main cavity" or "main waveguide") having one set of allowed modes between two other acoustic waveguides (also referred to as "termination waveguides") having a different set of allowed modes. Acoustic modes propagating in the main cavity (along the horizontal direction), upon arrival at the termination waveguides, are reflected by the termination waveguides. In this manner, these acoustic modes are confined in the horizontal direction within the space defined by two termination waveguides and, as discussed immediately above, further confined in the vertical direction within the space defined by the phononic crystal and the bulk wafer.

The phononic crystal approach to constructing acoustic resonators can have a significant impact on digital and RF circuits requiring clocks, oscillators and/or filters. For example, this approach can create sharp and monolithically integrated filters inside CMOS. The approach can also be used to create low-phase noise oscillators, eliminating the need for the bulky quartz crystals. With the advancement of on-chip micro- and nano-photonics, resonators described herein can be used for opto-mechanical coupling. For example, acoustic resoantors can be used in modulating laser beams propagating within on-chip optical waveguides or creating narrow-band light sources.

FIG. 1 shows a schematic of an acoustic resonator 100 using phononic crystals. The resonator 100 includes a wafer 150 (also referred to as a bulk wafer 150), on which three phononic crystals 110, 120, and 130 are disposed. The first phononic crystal 110 includes a first two-dimensional (2D) array of metal stripes 115. The other two phononic crystals 120 and 130 are disposed on opposite sides of the first phononic crystal 110 along a direction horizontal to the plane of the bulk wafer 150. The second phononic crystal 120 includes a second 2D array of metal stripes 125 and the third phononic crystal 130 includes a third 2D array of metal stripes 135. A filling material 160 is filled in the space within the metal stripes (115, 125, and 135), as well as in the spaces between the phononic crystals 110 and 120 and 110 and 130, and the spaces between the respective phononic crystals and the wafer 150.

The first phononic crystal 110 and the wafer 150 define a waveguide 140 to propagate allowed acoustic modes (also referred to as acoustic waves). These allowed modes are determined by the period ("first period") of the first 2D array of metal stripes 115 in the first phononic crystal 110. The second phononic crystal 120 has a different period ("second period") from the first period of the first phononic crystal 110. As a result, the waveguide defined by the second phononic crystal 120 and the wafer 150 allows propagation of a different set of acoustic modes. Acoustic modes propagating in the waveguide 140 are therefore reflected back when they arrive at the interface between the first phononic crystal 110 and the second phononic crystal 120. In other words, the second photonic crystal 120 and the wafer 150 effectively define an end reflector to reflect acoustic modes propagating in the waveguide 140.

Similarly, the third phononic crystal 130 also has a period ("third period") different from the first period of the first phononic crystal 110 and therefore can cause the waveguide defined by the third phononic crystal 130 and the wafer 150 to reflect acoustic modes propagating in the waveguide 140. In this manner, acoustic energy is confined within the space bounded by the first phononic crystal 110, the wafer 150, the second phononic crystal 120, and the third phononic crystal 130.

The first 2D array of metal stripes 115 in the first phononic crystal 110 can include various types of materials. In one example, the metal stripes 115 can include copper (Cu). In another example, the metal stripes 115 can include tungsten (W). In yet another example, the metal stripes 115 can include aluminum (Al). In yet another example, the metal stripes 115 can include a titanium tungsten alloy (TiW). In yet another example, the metal stripes 115 can include nickel (Ni). In yet another example, the metal stripes 115 can include gold (Au). In yet another example, the metal stripes 115 can include chromium (Cr). In yet another example, the metal stripes 115 can include a nickel chromium alloy (NiCr). In yet another example, the metal stripes 115 can include tantalum nitride (TaN). In yet another example, the metal stripes 115 can include palladium (Pd). In yet another example, the metal stripes 115 can include molybdenum (Mo). The second 2D array of metal stripes 125 and the third 2D array of metal stripes 135 can include similar materials.

In one example, the three phononic crystals 110, 120 and 130 use the same metal material for the metal stripes 115 to 135, respectively. In another example, the first phononic crystal 110 uses a first type of metal material, while the second phononic crystal 120 and the third phononic crystal 130 use a second type of metal material, different from the first type of metal material. In yet another example, each phononic crystal 110 to 130 can use a distinct type of metal material.

Each metal stripe in the first 2D array of metal stripes 115 has a rectangular cross section, as illustrated in FIG. 1. In practice, various other shapes can also be used. In one example, the metal stripes 115 can have a square cross section. In another example, the metal stripes 115 can have a round cross section. In yet another example, the metal stripes 115 can have an elliptical cross section. In yet another example, the metal stripes 115 can have a polygonal cross section. In yet another example, the metal stripes 115 can have any other shape known in the art. Similarly, the cross section of the second 2D array of metal stripes 125 and the third 2D array of metal stripes 135 can have any of the shape described above.

As shown in FIG. 1, the first 2D array of metal stripes 115 has five metal stripes (i.e., five rows) in the vertical direction for illustrative purposes. In practice, the number of rows in the first 2D array of metal stripes can be less than 5 or greater than 5. The number of rows in the second 2D array of metal stripes 125 and the third 2D array of metal stripes 135 can be similar to that in the first 2D array of metal stripes 115. In general, a larger number of rows can lead to a higher quality factor of the resulting resonator.

The number of metal stripes in the horizontal direction (i.e., number of columns) in the first 2D array of metal stripes 115 can depend on the desired length of the waveguide 140 along the propagation direction of the acoustic wave. As used herein, the length of the waveguide 140 is defined as the distance between the second phononic crystal 120 and the third phononic crystal 130. In general, a larger number of metal stripes on the horizontal direction can lead to a larger quality factor of the resulting resonator 100. On the other hand, a long waveguide 140 can be more susceptible to process variations and imperfections. One or more local variations along the waveguide 140 may act as a perturbation, resulting in scattering and coupling to different modes, which in turn may lead to spurious modes in the spectrum or decrease the quality factor of the resonator 100. In practice, the length of the waveguide 140 can be about 50 nm to about 50 µm (e.g., about 50 nm, about 100 nm, about 200 nm, about 500 nm, about 1 µm, about 2 µm, about 5 µm, about 10 µm, about 20 µm, or about 50 µm, including any values and sub ranges in between).

The first period (also referred to as the first pitch) of the first 2D array of metal stripes 115 can be about 10 nm to about 1 µm (e.g., about 10 nm, about 20 nm, about 50 nm, about 100 nm, about 200 nm, about 500 nm, or about 1 µm, including any values and sub ranges in between). The first period of the first 2D array of metal stripes 115 can affect the dispersion relation of the phononic crystal 110 including the location and width of the bandgap. In other words, the first period can be used to fabricate phononic crystals having the desired bandgap (see more details below).

In exemplary implementations, the second period of the second 2D array of metal stripes 125 is different from the first period of the first 2D array of metal stripes 115. In one example, the second period is greater than the first period. In another example, the second period is less than the first period. Generally, a larger difference between the first period and the second period can lead to a higher reflectivity on the interface between the first phononic crystal 110 and the second phononic crystal 120. In practice, the difference between the first period and the second period can be greater than 10% of the first period (e.g., about 10%, about 15%, about 20%, about 30%, about 50%, about 100%, about 200%, about 300%, or greater, including any values and sub ranges in between). In one example, the third period of the third 2D array of metal stripes 135 can be substantially the same as the second period. In another example, the third period can be different from the second period so as to, for example, provide different reflections on different end of the waveguide 140.

The wafer 150 can include any wafer material as used in current CMOS technologies, in which case techniques described herein can be fully compatible with CMOS processes. For example, the wafer 150 can include silicon. In another example, the wafer 150 can include sapphire. In yet another example, the wafer 150 can include gallium nitride (GaN). In yet another example, the wafer 150 can include GaN on silicon or any other material known in the art.

The filling material 160 as used in the resonator 100 can mechanically support the metal stripes 115, 125, and 135. The filling material 160 can also modify the dispersion relation of the phononic crystals 110, 120, and 130, thereby modifying the acoustic modes that can be confined within the waveguide (see more details in sections below). In one example, the filling material 160 can include silicon oxide (e.g., $SiO_2$). In another example, the filling material 160 can include silicon nitride (e.g., SiN or $Si_3N_4$). In yet another example, the filling material 160 can include SiCOH. In yet another example, the filling material 160 can include porous SiCOH. More details of fabrication methods are described below.

As described above, the second phononic crystal 120 and the wafer 150 define a reflector ("first reflector") to reflect acoustic modes propagating in the acoustic waveguide 140. Similarly, the third phononic crystal 130 and the wafer 150 also define a reflector ("second reflector"). Generally speaking, higher reflectivity of the two reflectors can lead to a higher quality factor of the resulting resonator 100. In practice, the reflectivity of the first and second reflectors can be greater than 90% (e.g., greater than 90%, greater than 95%, greater than 99%, greater than 99.5%, or greater, including any values and sub ranges in between). In one example, the two reflectors can have the same reflectivity. In another example, the two reflectors can have different reflectivity.

Acoustic Resonators Including Integrated Transducers and Sensing Elements

The acoustic resonator 100 shown in FIG. 1 and described above can confine acoustic energy from various sources. In one example, the resonator 100 can confine acoustic energy delivered by an external source and transmitted to the resonator 100 via an acoustic waveguide. In another example, the resonator 100 can confine acoustic energy generated within the resonator 100, in which case the resonator 100 can further include integrated transducers to convert electrical signals into acoustic waves.

Figure 2:
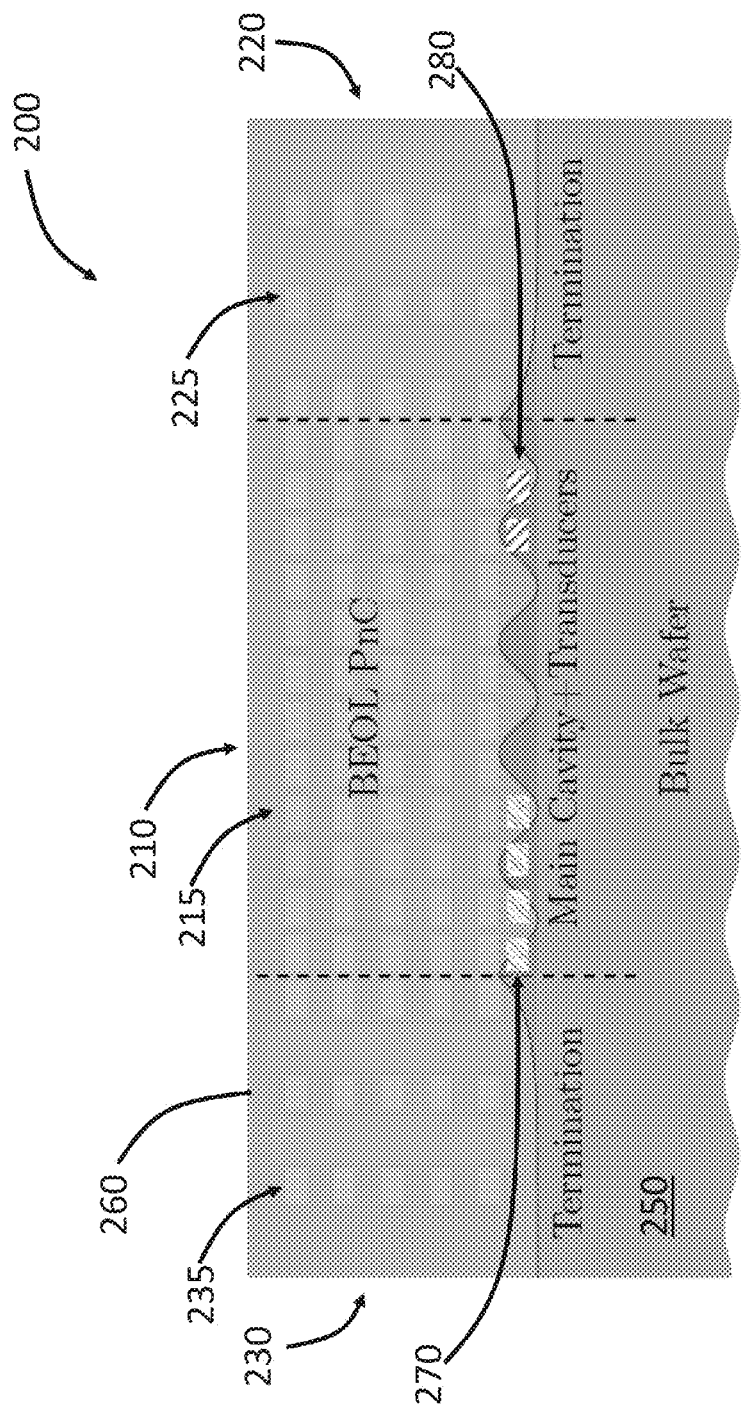
FIG. 2 shows a schematic of an acoustic resonator including integrated transducers and sensing elements.

FIG. 2 shows a schematic of a resonator 200 including integrated transducers and sensing elements. The resonator 200 includes a first phononic crystal 210, including a first 2D array of metal stripes 215, disposed on a wafer 250. A second phononic crystal 220, including a second 2D array of metal stripes 225, is disposed on the right side of the first phononic crystal 210. A third phononic crystal 230, including a third 2D array of metal stripes 235, is disposed on the left side of the first phononic crystal 210. A filling material 260 is disposed to fill spaces between metal stripes in the three arrays of metal stripes 215, 225, and 235, as well as to fill spaces between the phononic crystals 210 to 230 and the wafer 250. The three phononic crystals 210 to 230, the wafer 250, and the filling material 260 can be substantially similar to the three phononic crystals 110 to 130, the wafer 150, and the filling material 160, respectively.

The apparatus 200 also includes one or more (e.g., an array of) acoustic transducers 270 disposed between the first phononic crystal 210 and the wafer 250 so as to convert electrical signals into acoustic waves. The apparatus 200 further includes one or more (e.g., an array of) sensing elements 280 disposed between the phononic crystal 210 and the wafer 250 so as to convert acoustic waves into electrical signals. In this manner, the acoustic transducers 270 can function as an input coupler and the sensing elements 280 can function as an output coupler. FIG. 2 shows an array of acoustic transducers 270 and sensing elements 280 for illustrative purposes only. In practice, the resonator 200 can include any number of acoustic transducer(s) 270 and sensing element(s) 280. In addition, the resonator 200 can include any number of transducers 270 and/or sensing elements 280 in any order. For example, the transducers 270 can be on both side of a single sensing element 280. In another example, the sensing elements 280 can be on both sides of a single transducer 270 located in between. In yet another example, the transducers 270 and the sensing elements 280 can be disposed alternately (i.e., in an interleaved manner).

In one example, the acoustic transducers 270 can include field effect transistors (FETs), which can be readily integrated into the resonator 200 via CMOS technologies. In another example, the acoustic transducers 270 can include capacitors. In yet another example, the acoustic transducers 270 can include p-n junctions. In yet another example, the acoustic transducers 270 can include piezoelectric actuators that can vibrate in response to electrical current flowing through the actuators, thereby generating acoustic waves via vibration.

The sensing elements 280 can also include, for example, FETs, capacitors, p-n junctions, or piezoelectric actuators. However, these sensing elements 280 do not receive electrical signals. Instead, the sensing elements 280 receive the acoustic waves propagating in the resonator 200. The acoustic waves can modulate the electrical properties (e.g., carrier mobility) of the sensing elements 280, thereby modulating electrical signals delivered from the sensing elements 280. Properties of the acoustic waves (e.g., frequency, amplitude, etc.) can then be estimated from the modulation of the output signals from the sensing elements 280.

In some implementations, the array of acoustic transducers 270 can have the same period as the first 2D array of metal stripes 215 in the first phononic crystal 210. In other words, each acoustic transducer in the acoustic transducers 270 can be disposed below a corresponding metal strip in the metal stripes 215. In this example, adjacent acoustic transducers in the array of acoustic transducers 270 can be configured to generate acoustic signals having opposite phases (i.e., differential driving, see more details below) so as to generate desired wave vectors.

Phononic Crystals for Acoustic Resonators

As described above, phononic crystals (i.e., 110, 120 and 130 shown in FIG. 1) are building blocks of the acoustic resonator 100 shown in FIG. 1 (as well as the resonator 200 shown in FIG. 2). Phononic crystals (PnCs) are periodic composite structures with special dispersion characteristics that can be used to control the propagation of elastic waves through them. Bandgaps are distinctive features of PnCs' dispersion relations that, within a certain frequency band, prohibit the propagation of elastic waves in one or more directions. Through proper selection of materials, geometry and dimensions, PnC bandgaps can be engineered to provide high reflectivity for waves propagating in one or all directions. The inventors have recognized and appreciated that this feature makes PnCs very attractive for confining acoustic waves and constructing high-Q resonators and filters.

The width of the PnC bandgap can depend on several factors, including the acoustic impedance mismatch between metal stripes (e.g., metal stripes 115 shown in FIG. 1) and the surrounding dielectric material (e.g., filling material 160 shown in FIG. 1), as well as shape and dimensions of the unit cell in a phononic crystal. In CMOS technology, the back-end-of-line (BEOL) layers usually have several materials with large mismatch in acoustic impedance that can be leveraged to implement wide bandgap PnCs.

Table 1 shows the acoustic impedance for several common CMOS BEOL materials, such as silicon, $SiO_2$, SiCOH, and Tetraethylorthosilicate (TEOS). Metal materials listed in Table 1 include tungsten, copper, and aluminum. As seen in Table 1, copper metallization in low-k SiCOH dielectric background can provide an impedance contrast of about 19. In another example, tungsten in $SiO_2$ can provide an impedance contrast of about 7. Therefore, these combinations can be good candidates for PnC implementation. The large impedance mismatch, coupled with the small feature size available in CMOS, allows for PnCs with wide bandgaps that are ideal for energy confinement in unreleased resonators.

TABLE 1

Mechanical properties for popular materials in commercial CMOS technologies

| Material | $\rho$ (kg/m³) | $c_{11}$ (GPa) | $Z_{11}$ (M Rayl) | $c_{44}$ (GPa) | $Z_{44}$ (M Rayl) |
|---|---|---|---|---|---|
| Si<100> | 2329 | 194.3 | 91.2 | 79.5 | 13.6 |
| $SiO_2$ | 2200 | 75.2 | 12.9 | 29.9 | 8.1 |
| SiCOH | 1060 | 3.96 | 2.05 | 1.32 | 1.18 |
| TEOS | 2160 | 49.4 | 10.3 | 19.7 | 6.5 |
| Tungsten | 17600 | 525.5 | 96.2 | 160.5 | 53.1 |
| Copper | 8700 | 176.5 | 39.1 | 40.7 | 18.8 |
| Aluminum | 2735 | 111.1 | 17.4 | 28.9 | 8.9 |

FIGS. 3A-3C illustrate a phononic crystal 300 including parallel and periodic rectangular metal lines 310 disposed above a substrate 320. The phononic crystal can be implemented in, for example, IBM32SOI technology BEOL. FIG. 3A shows a unit cell of the phononic crystal, showing the mirror axes $\sigma_x$ and $\sigma_y$. The dashed lines indicate the periodic boundary conditions applied in simulations. FIG. 3B shows a First Brillouin Zone and an irreducible Brillouin zone (IBZ) of the reciprocal lattice for the unit cell shown in FIG. 3A. FIG. 3C shows a three-dimensional (3D) view of the full phononic crystal.

This phononic crystal 300 can be very favorable from a manufacturability point of view, because it is very similar to parallel bus connections commonly used in CMOS designs. Moreover, the structure of the phononic crystal 300 can be fabricated in full compliance with the design rule checking (DRC) rules of CMOS processes. In the particular example shown in FIGS. 3A-3C for the phononic crystal 300, the metal stripes (e.g., copper stripes) have a width and spacing in x-direction of 165 nm and 85 nm, respectively. The corresponding unit cell as well as the IBZ are shown in FIG. 3A. The unit cell has two mirror symmetries, namely $\sigma_x$ and $\sigma_y$, which along with time reversal symmetry can reduce the first Brillouin Zone to the rectangular IBZ shown in FIG. 3B. The IBZ doesn't have the rather familiar triangular shape (associated with square unit cells), due to the lack of the 90° (C4v) rotational symmetry. This is generally the case for most CMOS technologies. The unit cell can be assumed to have dimensions of a and b in the x and y directions, respectively.

Figure 4:
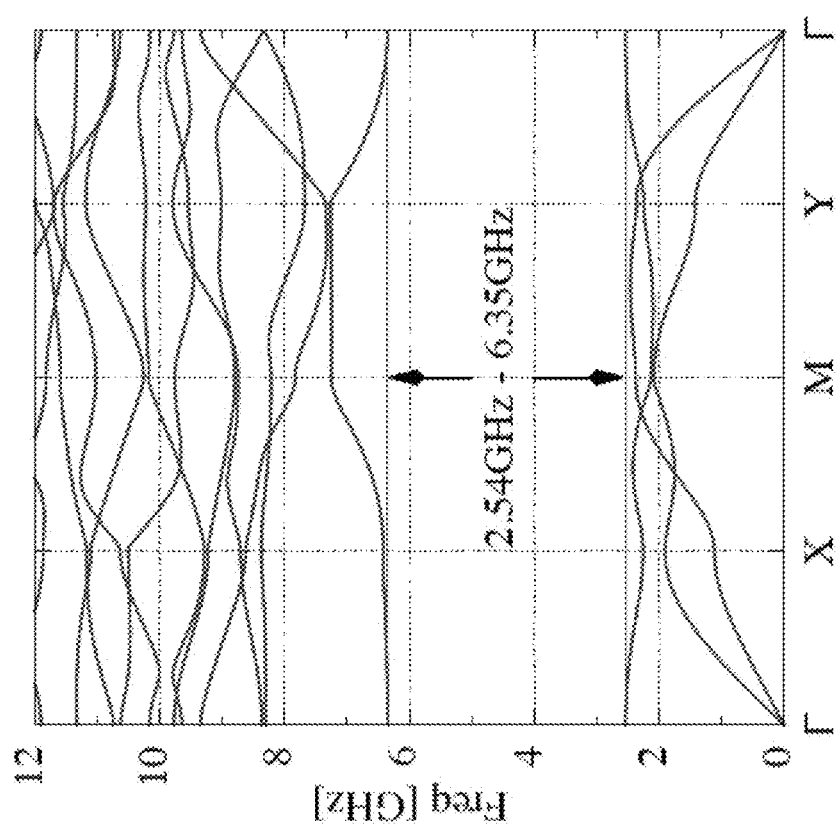
FIG. 4 shows the dispersion relation of the phononic crystal illustrated in FIGS. 3A-3C.

FIG. 4 shows the dispersion relation for the phononic crystal illustrated in FIGS. 3A-3C. The dispersion relation clearly shows a complete, 85% fractional bandgap between 2.54 GHz and 6.45 GHz. The bandgap has a width of about 3.8 GHz and a center frequency at 4.45 GHz. No waves are allowed to propagate in x or y directions in this bandgap. In other words, resonators constructed from the phononic crystal 300 can confine acoustic waves at frequencies between 2.54 GHz and 6.45 GHz.

Figure 5A:
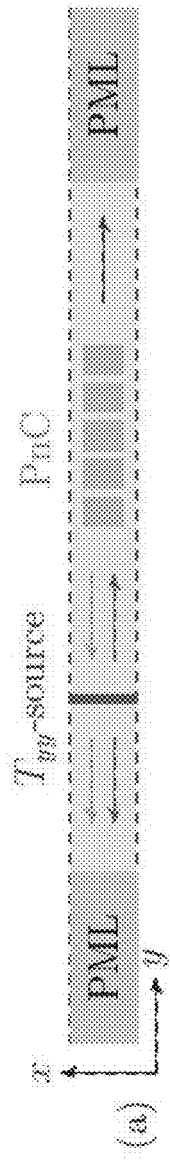
FIGS. 5A-5B show finite element modeling (FEM) results for 5 layers of the phononic crystal 300 illustrated in FIGS. 3A-3C.
Figure 5B:
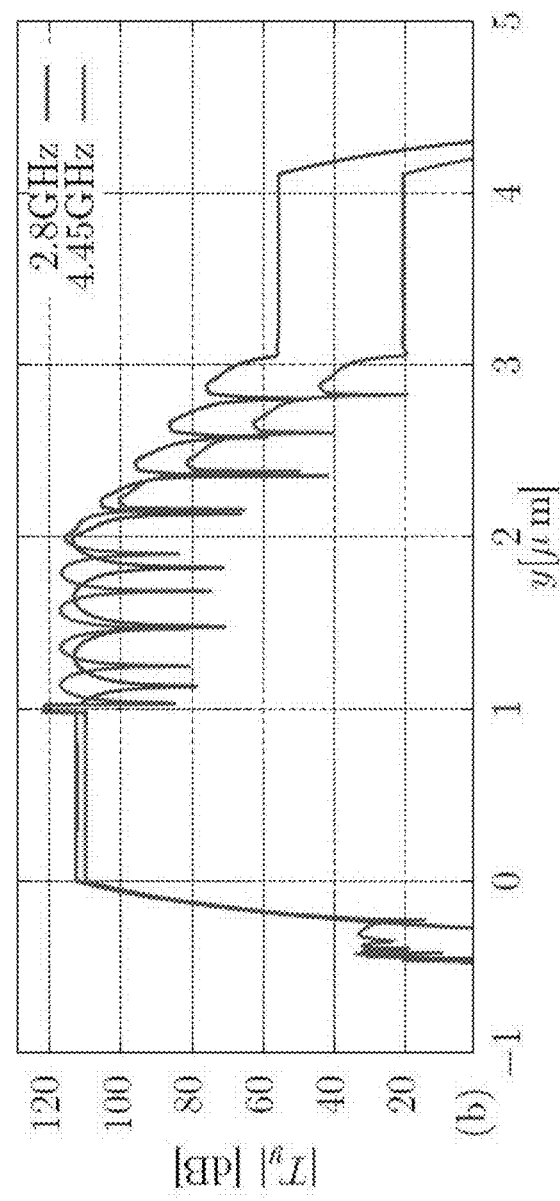

FIGS. 5A-5B show finite element modeling (FEM) results for 5 layers of the phononic crystal 300 illustrated in FIGS. 3A-3C. FIG. 5A illustrates the FEM model for 5 layers of the phononic crystal plotted horizontally. FIG. 5B show calculated magnitude of the stress field $|T_{yy}|$ along the structure, illustrating standing waves between the source and PnC, exponentially decaying waves in the PnC, and transmitted waves after the PnC.

In CMOS technologies, the number of layers (i.e. rows) in a phononic crystal may be limited by, for example, available facilities. Nevertheless, FIGS. 5A-5B show that with only 5 layers, the phononic crystal 300 can still achieve high reflectivity due to the high impedance contrast between the constituent materials. The vertical section of FIG. 5A is rotated horizontally for plotting convenience, such that the silicon substrate is on the left while the top of the CMOS stack is on the right. Periodic boundary conditions are enforced in the x-direction. A 1 MPa y-stress ($T_{yy}$) is applied from the wafer side, where transducers can launch waves towards the PnC and the wafer bulk. The wafer bulk can be modeled as a perfectly matched layer (PML) in this computation. Another PML can also be included on top (to the right in the rotated graph in FIG. 5A) of the PnC so as to reduce reflections back to the PnC.

Magnitude of the y-stress along the structure is shown in FIG. 5B. Standing waves are formed between the $T_{yy}$-source and the PnC due to the reflections from the PnC. The magnitude of $T_{yy}$ stress transmitted through the PnC is lower than the magnitude of the standing wave before the PnC. The difference is about 57 dB at 2.8 GHz and about 89 dB at 4.45 GHz. The strong evanescent decay of the stress wave inside the CMOS BEOL metal layers demonstrates the high efficiency of the PnC implementation, even though only five layers of metal stripes are used.

FIGS. 6A-6C illustrate a phononic crystal 600 including z-shaped unit cells. FIG. 6A shows a z-shaped unit cell in the phononic crystal 600, which can be implemented in, for example, IBM32SOI technology BEOL, with only inversion symmetry. The dashed lines indicate the periodic boundary conditions applied in FEM simulation. FIG. 6B show the First Brillouin Zone and IBZ of the reciprocal lattice for the unit cell of shown in FIG. 6A. FIG. 6C shows a 3D view of the full phononic crystal 600. As can be seen in FIG. 6C, the phononic crystal 600 includes a metal structure 610, which further includes metal stripes 612 vertically connected by metal vias 615. In this manner, metal stripes 610 on different rows are connected by the metal vias 615 into a zig-zag shaped metal structure.

The metal stripes 612 (e.g. copper stripes) in the phononic crystal 600 have width of about 125 nm and a spacing of about 67 nm, both in x direction. The only symmetry operation for this structure is inversion symmetry, and hence the IBZ includes two coinciding rectangles in the first Brillouin Zone as shown in FIG. 6B. This is the case since time reversal symmetry sets $\omega(k)=\omega(-k)$, and thus two coinciding rectangles can be sufficient to determine the IBZ in the most general case, even with the absence of any structural symmetry for the unit cell.

Figure 7:
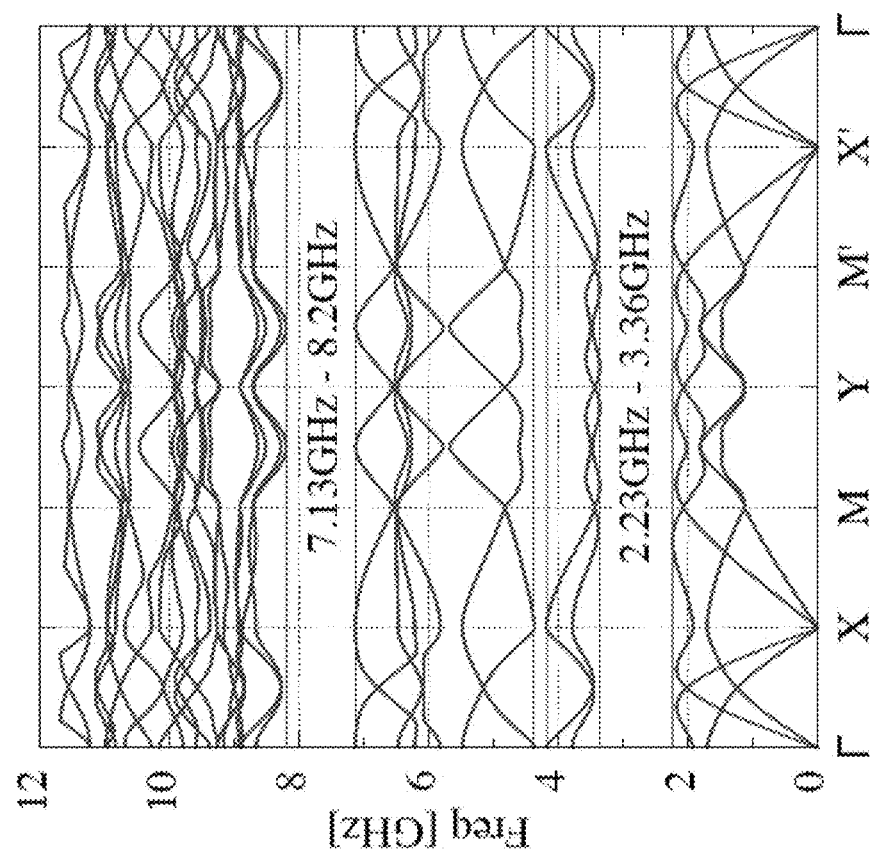
FIG. 7 shows the dispersion relation of the phononic crystal illustrated in FIGS. 6A-6C.

FIG. 7 shows that dispersion relation of the phononic crystal 600 illustrated in FIGS. 6A-6C. The dispersion relation shows two major bandgaps. The first major bandgap is between 2.23 GHz and 3.36 GHz, having a bandgap width of about 1.13 GHz. The second major bandgap is between 7.13 GHz and 8.2 GHz, having a bandgap width of about 1.07 GHz. The phononic crystal 600 can be advantageous for targeting higher frequencies, while the large width and separation of metal stripes 612 can be maintained for reliable manufacturing.

Figures 8A, 8B:
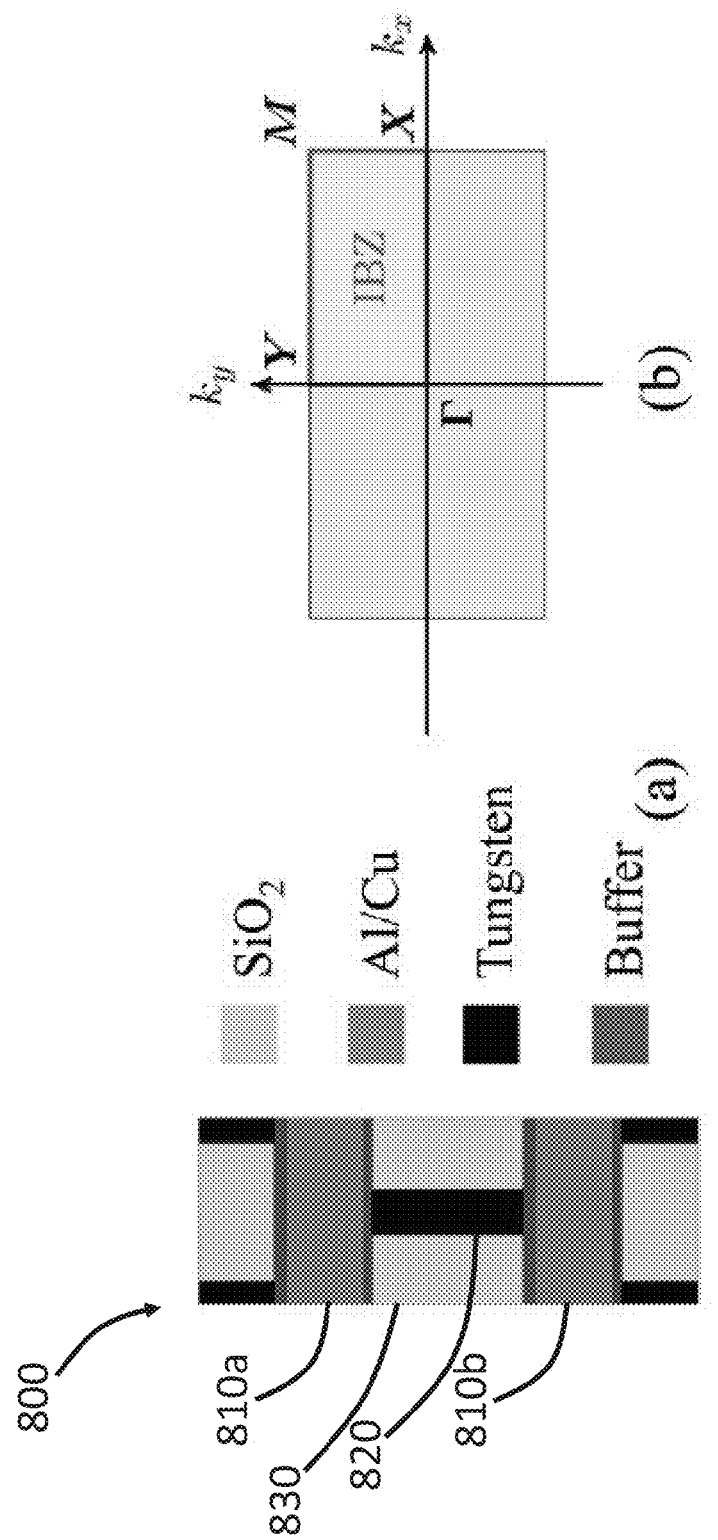
FIGS. 8A-8B illustrate a phononic crystal including metal stripes vertically connected by tungsten vias.

FIGS. 8A-8B illustrate a phononic crystal that can be implemented in XFab 0.18 μm technology BEOL. FIG. 8A shows a unit cell 800 in the phononic crystal. FIG. 8B shows the First Brillouin Zone and IBZ of the reciprocal lattice for the unit cell shown in FIG. 8A. The unit cell 800 includes two metal stripes 810*a* and 810*b* (aluminum stripes or copper stripe) vertically connected by a tungsten via 820. The tungsten via can have a length of about 850 nm. Spaces unoccupied by the metals are filled with a filling material 830, such as $SiO_2$. In addition, a buffer layer can be applied on the interface between metal stripes (i.e. 810*a* and 810*b*) and the filling material 830.

Figure 9:
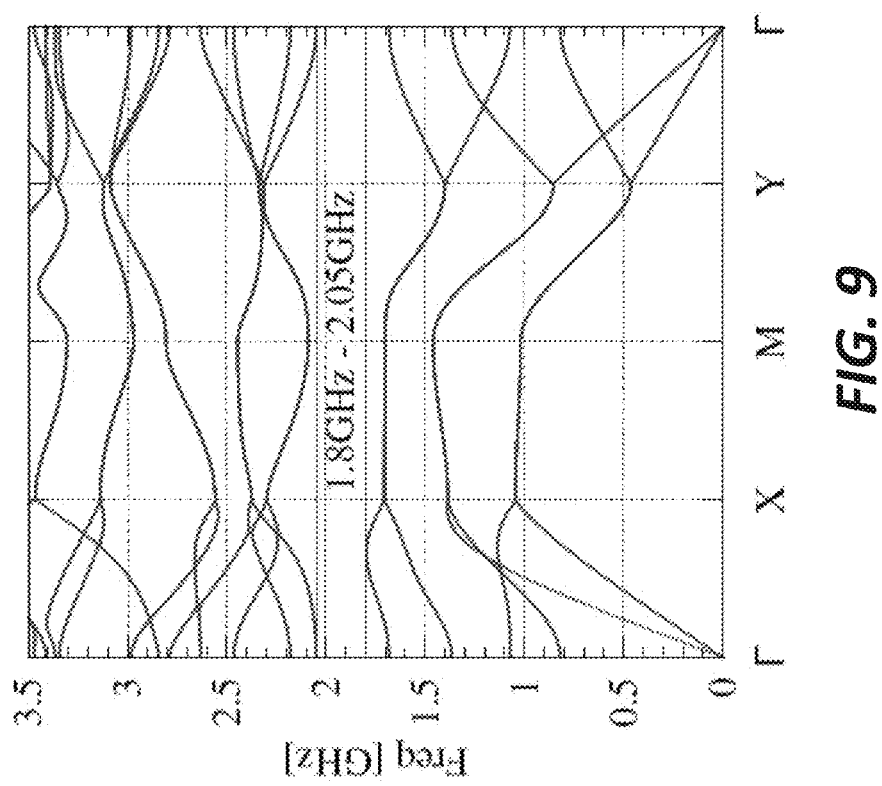
FIG. 9 shows the dispersion relation of the phononic crystal illustrated in FIGS. 8A-8B.

As can be seen from Table 1, tungsten surrounded by $SiO_2$ can provide large impedance contrast, thereby allowing large bandgaps to be created in the resulting phononic crystal. FIG. 9 shows the dispersion relation of the phononic crystal 800 shown illustrated in FIGS. 8A-8B, illustrating a 10% fractional bandgap between 1.80 GHz and 2.05 GHz and a bandgap width of about 250 MHz.

Another interesting feature of the phononic crystal illustrated in FIGS. 8A-8B is the relatively small impedance mismatch between aluminum and $SiO_2$. This small contrast can result in an extra degree of freedom for the aluminum routing traces without compromising the mechanical performance of the phononic crystal. Furthermore, the lower acoustic wave velocity in $SiO_2$ (compared to the acoustic wave velocity in aluminum) can allow index guiding between the aluminum layers 810*a* and 810*b*, which can further improve the performance of the phononic crystal.

Acoustic Waveguides Constructed from Phononic Crystals

FIG. 10 shows a cross section of a phononic crystal cell 1100 that can define an acoustic waveguide. FIG. 11 shows the dispersion relation of the phononic crystal 1100 calculated from FEM simulation. The phononic crystal cell 1100 can be formed, for example, using IBM 32 nm SOI technology. The cell 1100 shown in FIG. 10 is periodic in the x-direction so as to form a complete phononic crystal. Within each cell, multiple layers of metal stripes 1110*a* and 1110*b* (collectively referred to as the metal stripes 1110) are disposed above a bulk wafer 1130. A filling dielectric material 1120 is disposed in the gaps defined by the metal stripes 1110.

Various optional components can be included between the metal stripes 1110 and the bulk wafer 1130, including a buried oxide layer 1140 disposed on the bulk wafer 1130, a body layer 1150 disposed on the buried oxide layer 1140, an FET layer 1160 disposed on the body layer 1150, and a Tetraethylorthosilicate (TEOS) layer 1170 disposed on the FET layer 1160.

2D FEM simulations can be used to find the dispersion relation of a phononic crystal made of an array of the cell 1100 disposed along the x direction. The periodicity in the x-direction only can result in a discrete translational symmetry, which in turn causes the $k_x$ component of the k-vector to be conserved (in space and time) throughout the entire phononic crystal. For this reason, calculations of dispersion relation can use only $k_x$. Different types of modes can be observed in this dispersion relation, as shown in FIG. 11.

Acoustic modes that can propagate within the phononic crystal (i.e. within the metal stripes 1110) are referred to as the PnC propagating modes. These PnC propagating modes form continuous bands designated as PnC band 1 and PnC band 2 in FIG. 11. The gap between PnC band 1 and PnC band 2 is the bandgap of the phononic crystal. Acoustic modes within the bandgap cannot propagate into the metal stripes 1110.

Acoustic modes that can propagate in the bulk wafer 1130 are referred to as the bulk propagating modes. Thee dispersion relation of bulk propagating modes can be given as $\omega = c|\vec{k}| = c\sqrt{k_x^2 + k_y^2}$, where c is the acoustic wave velocity (being longitudinal or shear waves) in the bulk wafer 1130, k is the wave vector, $k_x$ and $k_y$ are the components of the wave vector k in the x and y directions, respectively. Thus, for a given $k_x$, the allowed modes in the bulk wafer 1130 form a continuum $\omega > ck_x$, referred to as the sound-cone and bounded by the sound-line $\omega = ck_x$.

Acoustic modes that cannot propagate in the bulk wafer 1130 are referred to as the bulk evanescent modes. These bulk evanescent modes are located below the sound-line, with $\omega < ck_x$ and imaginary $k_y$. They decay exponentially in the bulk in the y-direction. This phenomenon corresponds to index guiding in photonic waveguides: a generalization of the total internal reflection obtained from Snell's law with incidence angle bigger than the critical angle.

Acoustic modes that do not propagate within the phononic crystal are referred to as the PnC evanescent modes, which are located in the PnC bandgap (between PnC band 1 and PnC and 2 in FIG. 11). PnC evanescent modes decay exponentially in the PnC and are not shown in PnCs' dispersion relations since they do not exist in infinite, perfectly-periodic structures.

FIG. 11 also shows localized modes that are located below the sound-cone and within the PnC bandgap. These modes show evanescent exponential decay in both the PnC and bulk and therefore can only propagate in the space between the metal strips 1110 and the bull wafer 1130. This confinement can result in a discrete spectrum of modes. Without further constraints in the lateral dimensions, wave propagation is allowed between the PnC and bulk wafer in the x-z plane, forming a horizontal waveguide. Such waveguiding can provide acoustic confinement for the resonator. The full resonator structure can impose additional constraints to confine the waves in the horizontal direction, creating a resonance cavity (see details below).

It can be helpful to notice that the buried oxide (BOX) layer 1140 of the SOI wafer may play no role in the formation of this horizontal acoustic waveguide. Without being bound by any particular theory or mode of operation, the waveguide is formed mainly because the sound velocity within the bulk wafer 1130 is larger than that in the surface and the fact that these modes are inside the PnC bandgap and cannot propagate upwards. Thus PnC-based horizontal acoustic waveguides are not exclusively limited in any way to SOI technologies: the concept is readily applicable in CMOS bulk technologies as well.

Figure 12:
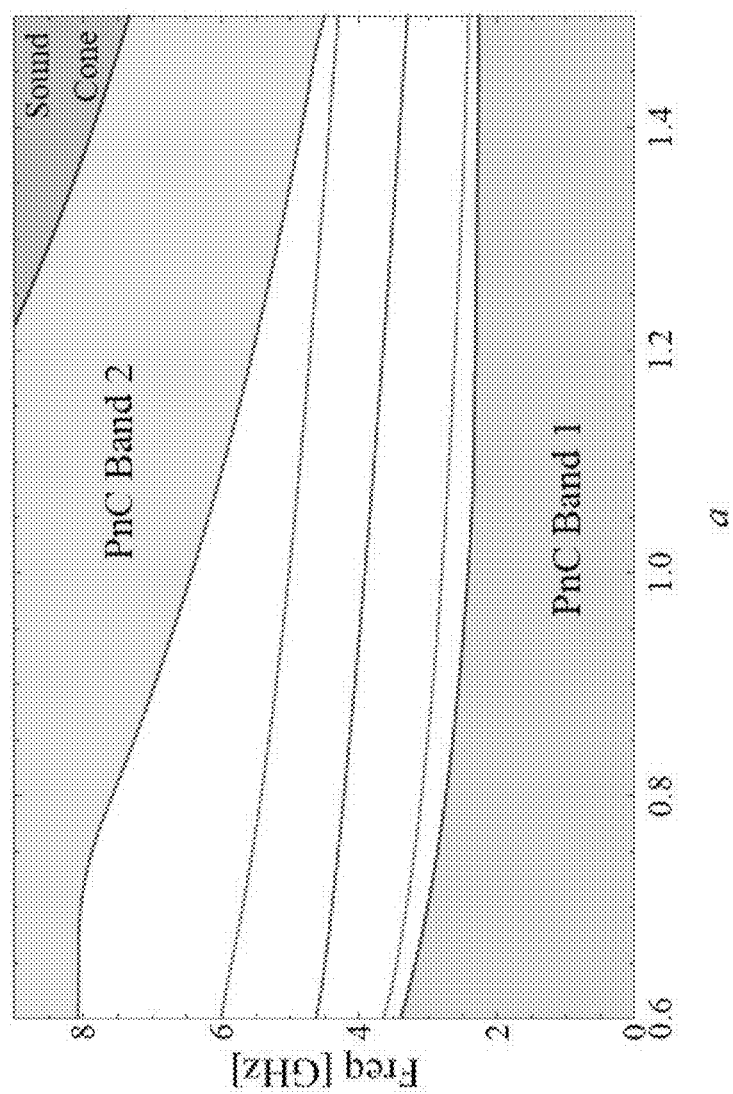
FIG. 12 shows eigenfrequencies at $k_x=\pi/a$ for the waveguide shown in FIG. 10 as function of the period a of the phononic crystal.

FIG. 12 shows eigenfrequencies at $k_x = \pi/a$ for the waveguide shown in FIG. 10 as function of the period a of the cell. The structure in FIG. 10 has isotropic scaling, which provides a proportional scaling of the eigenfrequencies with respect to dimensions of the structure. This scaling can be readily used to engineer the dispersion relation of the phononic waveguides. However, since in CMOS technologies the designer typically can only control the horizontal dimensions, the resulting scaling is not ideally isotropic. Instead, the corresponding scaling of eigenfrequencies is sublinear. Nevertheless, the scaling can still provide a degree of freedom in the phononic waveguides design. Actual waveguide design may benefit from separate tuning for the metal width and separation of the phononic crystal to further optimize the desired mode shape (stress distribution) in the waveguide as well as its dispersion characteristics.

Being able to engineer the dispersion relation of the waveguide is a useful capability. For example, engineering the dispersion relation can provide a control over the resonance frequency of the resulting resonator. Moreover, in the same resonator, waveguides with different dispersion relation can be used to create a distinct separation between a main cavity and a termination section (see details in the next section below).

Acoustic Resonators Defined by Acoustic Waveguides

Based on the discussions above, various types of acoustic resonators can be constructed from phononic crystals. In the descriptions with reference to FIG. 1, an acoustic resonator generally includes a main cavity defined a first phononic crystal disposed on a bulk wafer and two termination waveguides, each of which is defined by a respective phononic crystal disposed on the bulk wafer. The phononic crystals defining the termination waveguides have a different period from the period of the first phononic crystal defining the main cavity. In addition, the acoustic resonator can further include acoustic transducers to convert electrical signals into acoustic waves to be confined and sensing elements to couple acoustic waves out of the resonator.

Main Cavity

The main cavity (e.g., waveguide 140 shown in FIG. 1) can be the central part of an acoustic resonator based on phononic crystals. It has a propagating mode exactly at the operating frequency of the resonator. On both sides, waveguide termination sections are included to provide the acoustic wave reflection needed for the resonator. A good resonator can have high stresses and high stored energy confined to the main cavity. The confined energy can decay exponentially in the termination waveguide sections on both sides. The main cavity can also include the driving and sensing transducers, which can be Metal Oxide Semiconductor Capacitors (MOSCAPs) and Metal Oxide Semiconductor Field Effect Transistors (MOSFETs), respectively.

While the inclusion of the MOSFETs in the FEOL layers may affect the specific dispersion relation of the waveguide, they typically do not affect the waveguiding concepts presented above. This is because the waveguiding is a result of the PnC bandgap preventing the modes from propagating upwards as well as the higher sound velocity in the bulk wafer resulting in index guiding.

FET Driving and Sensing

FET sensing can be an attractive choice to harness the high-quality, high-yield MOSFETs available in CMOS technologies. In MOSFETS, elastic wave stresses can modulate the carrier mobility in the transistor channel by virtue of piezoresistivity. Some implementations also involve carrier density modulation when the base transistor material is piezoelectric, or when large strains are induced in the gate dielectric. Both effects can create a small signal AC current in the read-out circuit when the FET is biased properly.

The spatial configuration of the driving FETs favors a distribution of $k_x$ values near $k_x=\pi/a$, where a is the period of the metal stripes in the phononic crystal defining the resonator. Specific waveguide modes from the dispersion relation (e.g., shown in FIG. 11) can be excited. These modes can then become the resonator modes. Driving near $k_x=\pi/a$ can be beneficial for reducing scattering to the bulk wafer sound cone, enabling larger quality factors. The driving FETs can be operated in strong inversion, where their behavior closely matches that of a parallel plate capacitor in terms of the generated stress.

In order to benefit the most from the phononic waveguides, it can be beneficial to operate the furthest possible from the sound line, specifically at $\beta=\pi/a$. Operating at a specific $\beta$ can be enforced by the spatial configuration of the driving transducers (the MOSCAPs). Physically, operating at $\beta=\pi/a$ corresponds to fields in the neighboring waveguide periods being out-of-phase by 180°. This can be implemented by fully-differential driving of the resonator, forcing neighboring periods to be out-of-phase.

Figure 13:
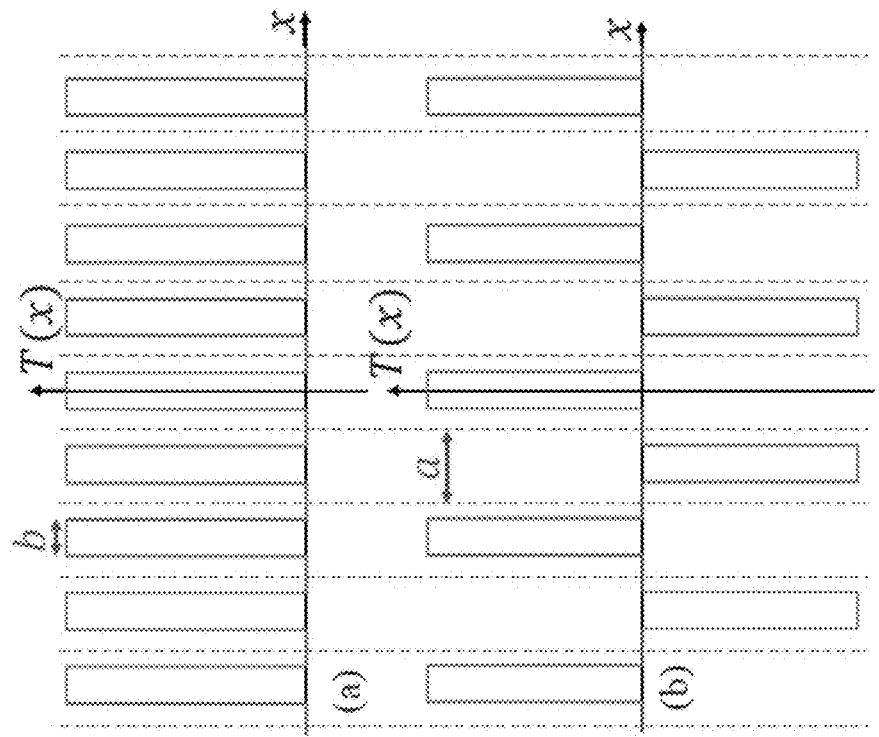
FIG. 13A shows spatial actuation stress distribution in an in-phase driving scheme that can be used in acoustic resonators based on phononic crystals.
FIG. 13B shows spatial actuation stress distribution in a fully differential driving scheme that can be used in acoustic resonators based on phononic crystals.

FIG. 13A shows spatial actuation stress distribution in an in-phase driving scheme. FIG. 13B shows spatial actuation stress distribution in a fully differential driving scheme. FIGS. 13A-13B are presented here to illustrate the benefits of fully differential driving schemes in acoustic resonators based on phononic crystals.

A better understanding of why fully-differential driving generates excitation near $\beta=\pi/a$ can be illustrated by studying the different spatial stress distribution in the reciprocal lattice ($\vec{k}$-space). First consider a perfectly periodic in-phase driving actuating stress distribution like that shown in FIG. 13A. The structure period is a, whereas the driving stress is assumed to be uniform over a length b<a (b is approximately the MOSCAP gate length). Such stress distribution can be represented in the real geometrical space by the Heaviside $\Pi(x)$ function as $$T(x) = T_o \Pi\left(\frac{x}{b}\right), \forall x \in \left[-\frac{a}{2}, \frac{a}{2}\right] \text{ and} \quad (1)$$

$$T(x + na) = T(x), \forall n \in \mathbb{Z}.$$

The relation between the real and reciprocal lattice is given by Fourier series as:

$$T(x) = \sum_{-\infty}^{\infty} T_n \exp\left(i\frac{2\pi n}{a}x\right); T_n = \frac{1}{a}\int_{-a/2}^{a/2} dx \exp\left(-i\frac{2\pi n}{a}x\right) \quad (2)$$

The Fourier coefficients for in-phase driving stress are thus found to be:

$$T_n = T_o \frac{\sin(n\pi b/a)}{n\pi} = \frac{T_o b}{a}\text{sinc}\left(\frac{n\pi b}{a}\right) \quad (3)$$

where the coefficients correspond to the $\beta=2n\pi/a$ in $\vec{k}$-space. The in-phase driving scheme shows the strongest coupling into the sound at $\beta=0$, with the highest component $T_0=T_o b/a$, or the DC value of the driving stress. This corresponds to the physical picture of radiating uniform plane wave normal to the waveguide propagating downward into the bulk wafer. Moreover, this in-phase coupling typically has no components near $\beta=\pi/a$ and hence may not drive the guided modes of the phononic waveguides.

On the other hand, consider the fully-differential driving scheme shown in FIG. 13B, where neighboring waveguide periods are driven 180° out-of-phase. The driving stress has a spatial period of 2a, twice that of the waveguide. The stress spatial distribution is given by $$T(x) = -T_o \Pi\left(\frac{x+a}{b}\right) + T_o \Pi\left(\frac{x}{b}\right) - T_o \Pi\left(\frac{x-a}{b}\right), \quad (4)$$

$$\forall x \in [-a, a]$$

The Fourier series expansion in k-space becomes:

$$T(x) = \sum_{-\infty}^{\infty} T_n \exp\left(i\frac{n\pi}{a}x\right); T_n = \frac{1}{2a}\int_{-a}^{a} dx T(x)\exp\left(-i\frac{n\pi}{a}x\right) \quad (5)$$

The Fourier series coefficients simplifies to:

$$T_n = -i^{3n+1} T_o \operatorname{sinc}\left(\frac{n\pi}{2}\right)\sin\left(\frac{n\pi b}{2a}\right) \quad (6)$$

where the coefficients correspond to $\beta = n\pi/a$ in $\vec{k}$-space. The coefficients vanish for even values of $n = \ldots, -2, 0, 2, \ldots$, corresponding to $\beta = 2m\pi/a$, $m \in \mathbb{N}$; leaving only odd $\eta$ components. The largest component occurs at $n=1$, corresponding to $\beta = \pi/a$. Thus, fully-differential driving strongly couples to the guided waveguide modes at $\beta = \pi/a$ without coupling into the sound cone.

There is an intuitive physical explanation as to why this particular driving pattern actually reduces scattering into the bulk wafer sound cone. One can think of a fully-differential transducer array enforcing $\beta = \pi/a$ for the resonator. If an observer is located far away in the bulk wafer, much further than the array size, all the transducers eventually look like point sources. With the observation distance being much larger than the individual separation between the sources, the distance traveled by the waves from all the sources can be almost the same. This can cause the superimposing waves at the observer to acquire almost the same phase shift, and hence they can all arrive with 180° out-of-phase with each other. Thus, their superposition can vanish, resulting in no radiation into the bulk wafer.

Unlike the ideal structures discussed above, realistic acoustic resonators do not have infinite number of unit cells. The limited structure periodicity can strongly affect the expansion coefficients in the $\vec{k}$-space. From the well-known properties of Fourier analysis, the non-periodic structure can result in a continuous spectrum in $\vec{k}$-space as opposed to the discrete expansion coefficients of Equations (3) and (6). Fourier transform can be used in this case. The driving stress in a finite structure with N periods can be expressed as $$\tau(x) = T_o \Pi\left(\frac{x - a/2}{b}\right) - T_o \Pi\left(\frac{x + a/2}{b}\right), \forall x \in [-a, a] \quad (7)$$

$$T(x) = \sum_{m=0}^{N-1} \tau(x - 2ma) \quad (8)$$

where $\tau(x)$ has been defined as stress in a fully-differential period. The Fourier transform pair used to relate the real space and the $\vec{k}$-space is defined as:

$$\tilde{T}(\beta) = \frac{1}{\sqrt{2}}\int_{-\infty}^{\infty} dx T(x)e^{-i\beta x}; T(x) = \frac{1}{\sqrt{2\pi}}\int_{-\infty}^{\infty} d\beta \tilde{T}(\beta)e^{i\beta x} \quad (9)$$

Figure 14:
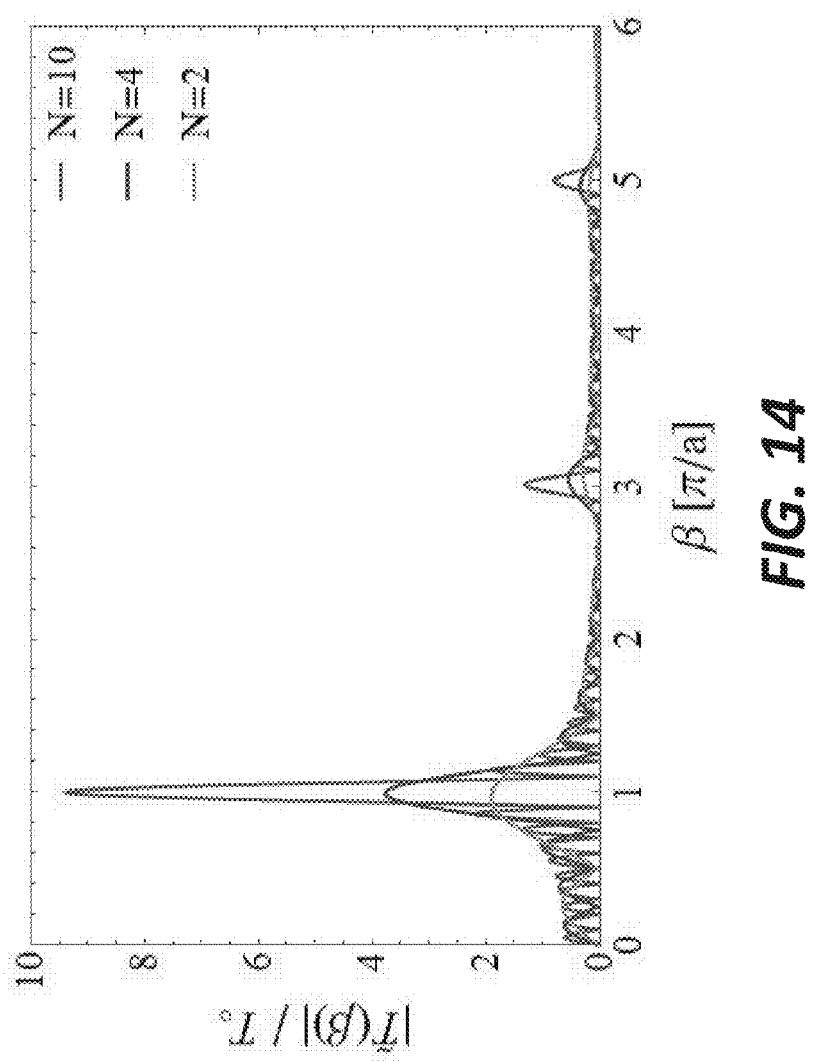
FIG. 14 shows Fourier decompositions for different number of periods in an acoustic resonator based on phononic crystals in order to compare the effect of the number of periods on the confinement efficiency of the resonator.

FIG. 14 shows Fourier decomposition for different number of periods in order to compare the effect of the number of periods. In order to obtain numerical results, the ratio b/a can be assumed at around 75%, which is typical for many acoustic resonators. As expected, increasing the number driving periods both increases the magnitude of the driving component in $\vec{k}$-space as well as resulting in a narrower spectrum. Narrower driving spectrum in $\vec{k}$-space can be highly favorable in minimizing scattering and coupling to the sound cone. However, this benefit may come at the cost of a larger resonator footprint. In practice, four fully-differential driving periods can be used on each side of the sensing MOSFETs for a total of eight driving periods. This configuration can provide good confinement with reasonable resonator footprint.

As in the case with fully-differential driving, fully-differential sensing can also be used, making the resonator a balanced-balanced device. Fully differential sensing can also help in rejecting modes away from $\beta = \pi/a$. The full resonator can be thought of as a three-stage system, including a driving stage that converts input voltage to stress, a mechanical resonance that filters the resulting stress with high selectivity, and a sensing stage that converts the stress back to output current. With both driving and sensing favoring modes close to $\beta = \pi/a$, the effect of scattering and non-idealities can be significantly reduced.

Termination Waveguides

The main phononic waveguide structure provides vertical energy confinement for the resonance cavity. Yet it allows waves to propagate freely in the horizontal direction inside the FEOL layers. Horizontal confinement can be achieved through reflections at the ends of the main phononic waveguide cavity. Such reflections arise due to a systematic mismatch between the acoustic impedance and dispersion characteristics of the main cavity waveguide and its boundaries. A suitable termination can provide such mismatch in a way that can maximize the specular reflections with negligible scattering.

Figure 15:
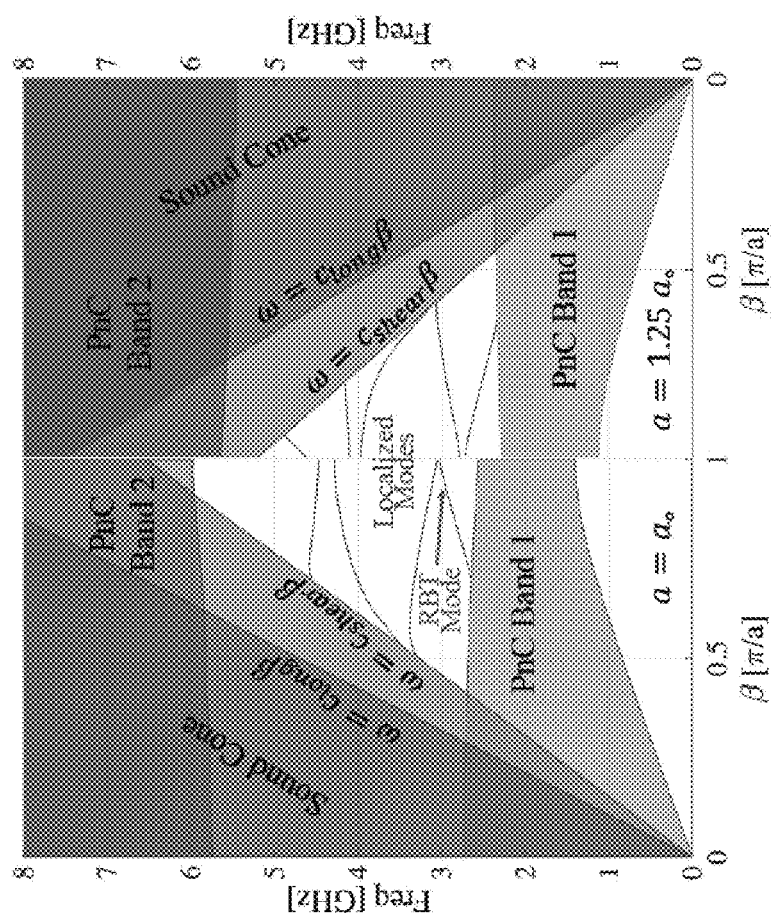
FIG. 15 shows dispersion relations of a main cavity waveguide (left) and a termination waveguide with 25% larger period (right).

FIG. 15 shows dispersion relations of a main cavity waveguide (right) and a termination waveguide with 25% larger period (left). The main cavity waveguide mode falls into the partial bandgap of the termination waveguide. As discussed above, the dispersion relation of the phononic waveguides can be engineered by controlling their periodicity among different dimensions. The cavity termination can thus be implemented as a waveguide similar to the main cavity waveguide, while incorporating different periodicity or dimensions to produce a mismatch in the dispersion characteristics.

FIG. 15 shows a comparison between the dispersion relation of a main cavity waveguide and a possible termination waveguide. An arbitrary 25% larger period has been selected for the termination waveguide, leaving the main cavity mode in a partial bandgap of the termination waveguide. It is important to note that the larger period for the termination can shift the dispersion relation down, causing the main cavity mode to be above the entire termination mode curve and hence avoiding coupling to the termination mode curve. A termination with smaller period than the main cavity can also be used in practice.

When compared to abrupt termination of the main cavity, a termination based on a similar waveguide with mismatched dispersion characteristics represents smaller perturbations to the cavity structure. This can provide the desired reflections without inducing significant scattering. It is also useful to note that the phononic waveguides have discrete modes, and when operating far from the sound line, scattering amplitudes can be decreased in general (since there is no close by modes in the $\vec{k}$-space at the same frequency that can easily couple to the main cavity mode). Moreover, employing a waveguide for termination has the advantage that it provides the ability to precisely engineer the termination in order to optimize the quality factor of the RBT cavity. Also, for minimal scattering, an adiabatic transition (discussed below) can be used, allowing a gradual and slow change of the waveguide period between the main cavity and the termination. In general, numerical optimization can be used to find the best termination dimensions for minimal scattering.

Acoustic Resonators Including Fully Differential Driving Transducers

Figure 16:
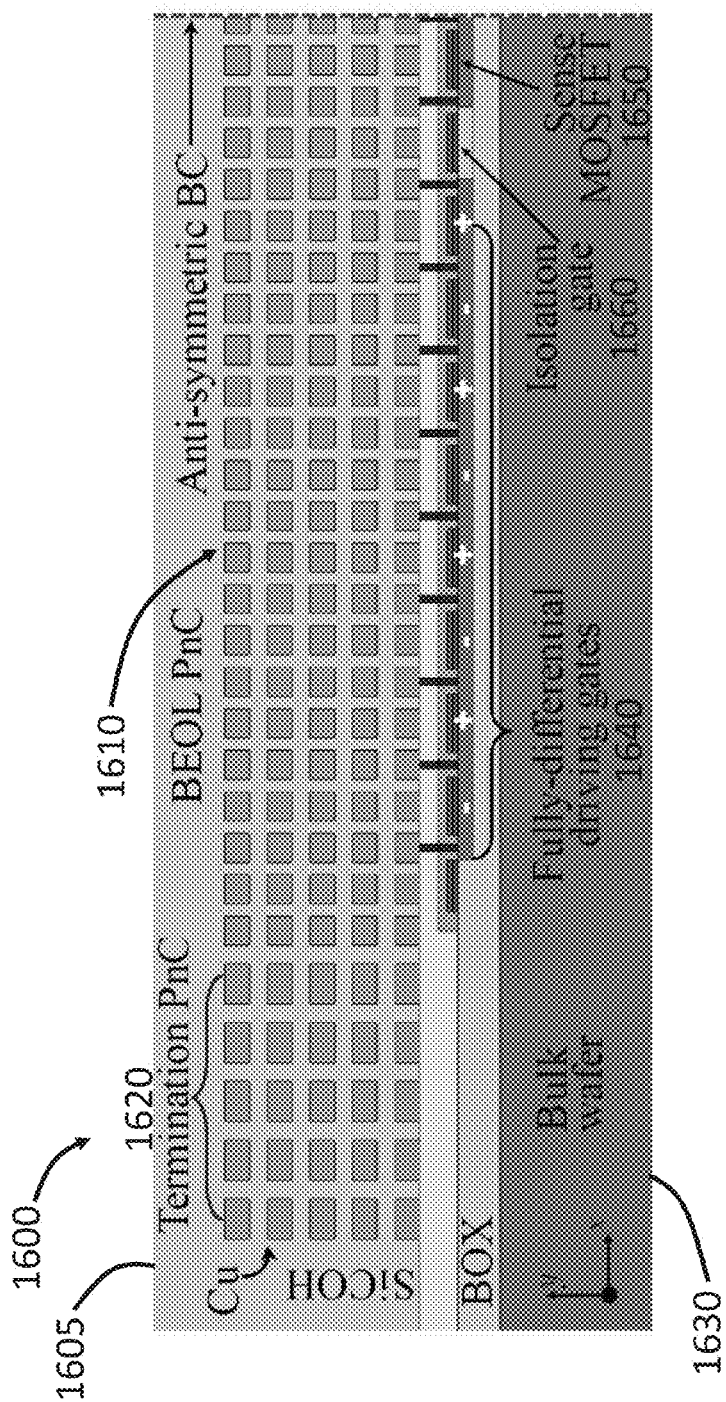
FIG. 16 shows a cross section of the left-half of an acoustic resonator including fully differential driving.

FIG. 16 shows a cross section of the left half of an acoustic resonator 1600 (designated as resonator body transistor A or RBT A) including fully differential driving gates. The structure seen in FIG. 16 is anti-symmetric about the y-axis. Anti-symmetry represents a symmetric geometry with anti-symmetric loads. The acoustic resonator 1600 includes a first phononic crystal 1610 disposed on a wafer 1630 so as to define a main cavity. A termination phononic crystal 1620 is disposed on the side of the first phononic crystal 1610 to define a termination waveguide. The termination phononic crystal 1620 has a larger period compared to the first phononic crystal 1610. A filling material 1605 is disposed in the gaps between metal stripes in the phononic crystals 1610 and 1620.

The phononic crystal 1600 also includes an array of acoustic transducers 1640 (e.g., MOSCAPs) disposed between the first phononic crystal 1610 and the wafer 1630 so as to carry out fully differential driving. A sensing element 1650 (e.g., MOSFET) is also disposed between the first phononic crystal 1610 and the wafer 1630 to convert acoustic waves back into electrical signals. In addition, the acoustic resonator 1600 can further include an optional isolation gate 1660 disposed between the acoustic transducers 1640 and the sensing element 1650 for isolation.

Figure 17:
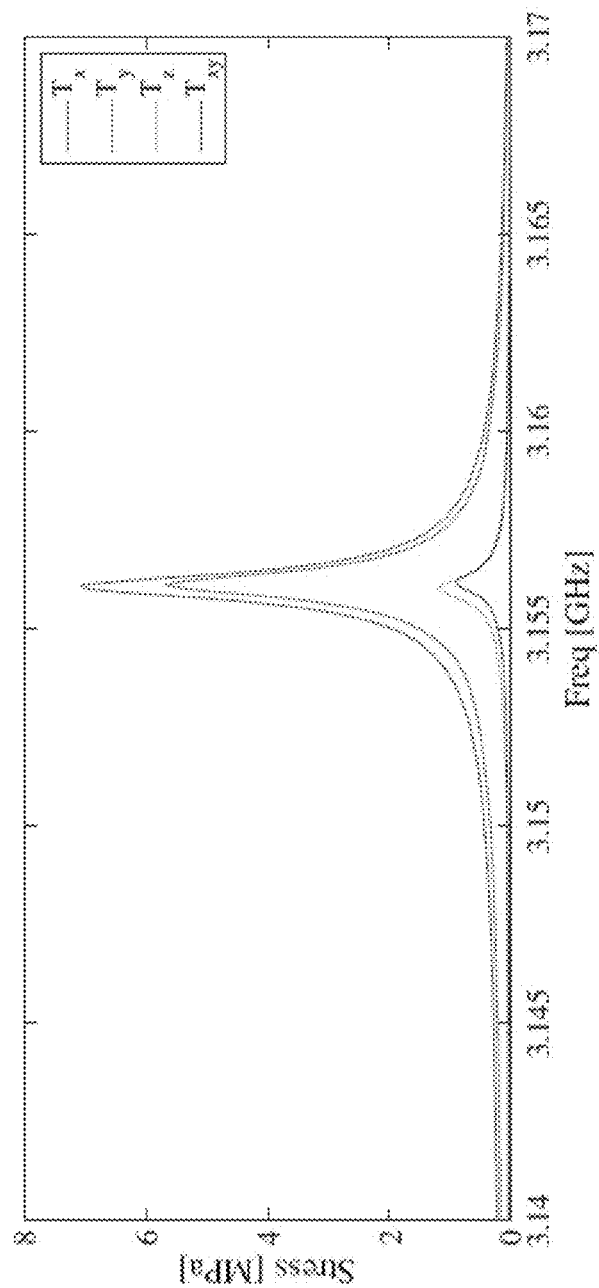
FIG. 17 shows simulation results of the average stresses at the sensing elements in the acoustic resonator shown in FIG. 16 with a resonance at 3.155 GHz.

FIG. 17 shows simulation results of the average stresses at the sensing elements in the acoustic resonator 1600 shown in FIG. 16 with a resonance at 3.155 GHz.

Figure 18:
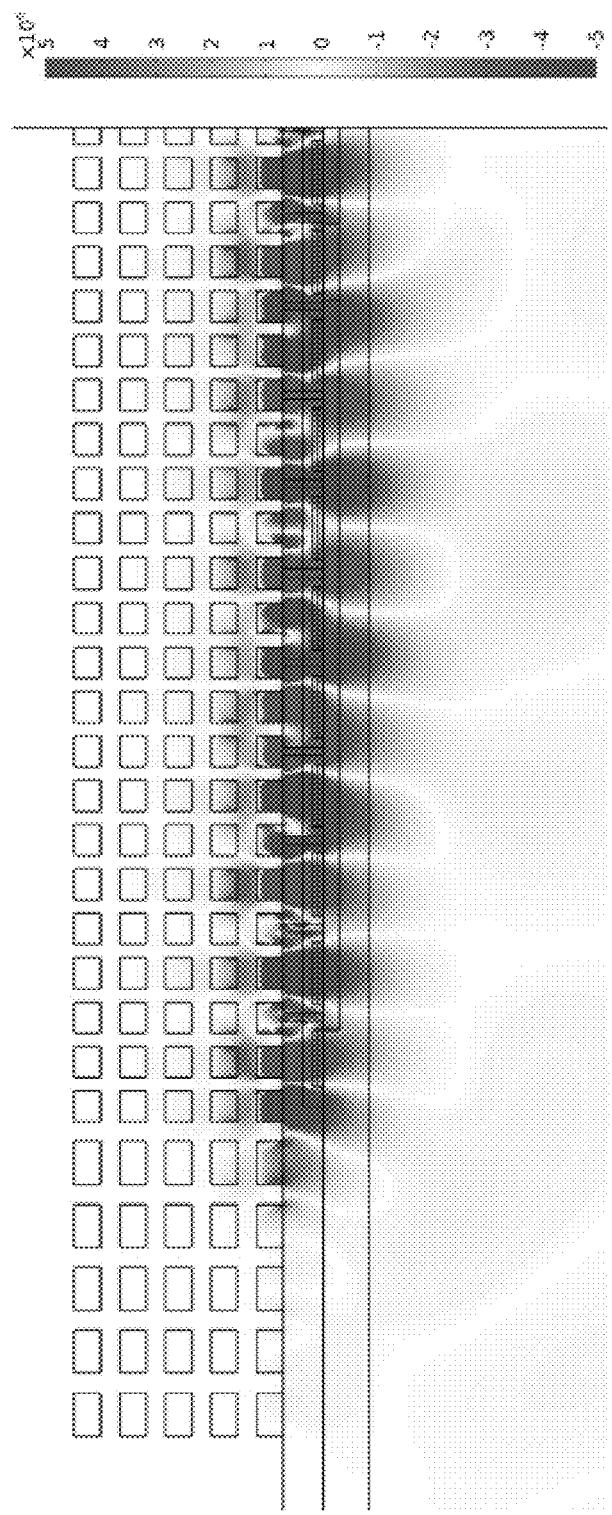
FIG. 18 shows FEM simulation illustrating the y-stress $T_{yy}$ for the acoustic resonator illustrated in FIG. 16 at the 3.155 GHz resonance mode.

FIG. 18 shows FEM simulation illustrating the y-stress $T_{yy}$ for the acoustic resonator 1600 illustrated in FIG. 16 at the 3.155 GHz resonance mode.

Figure 19:
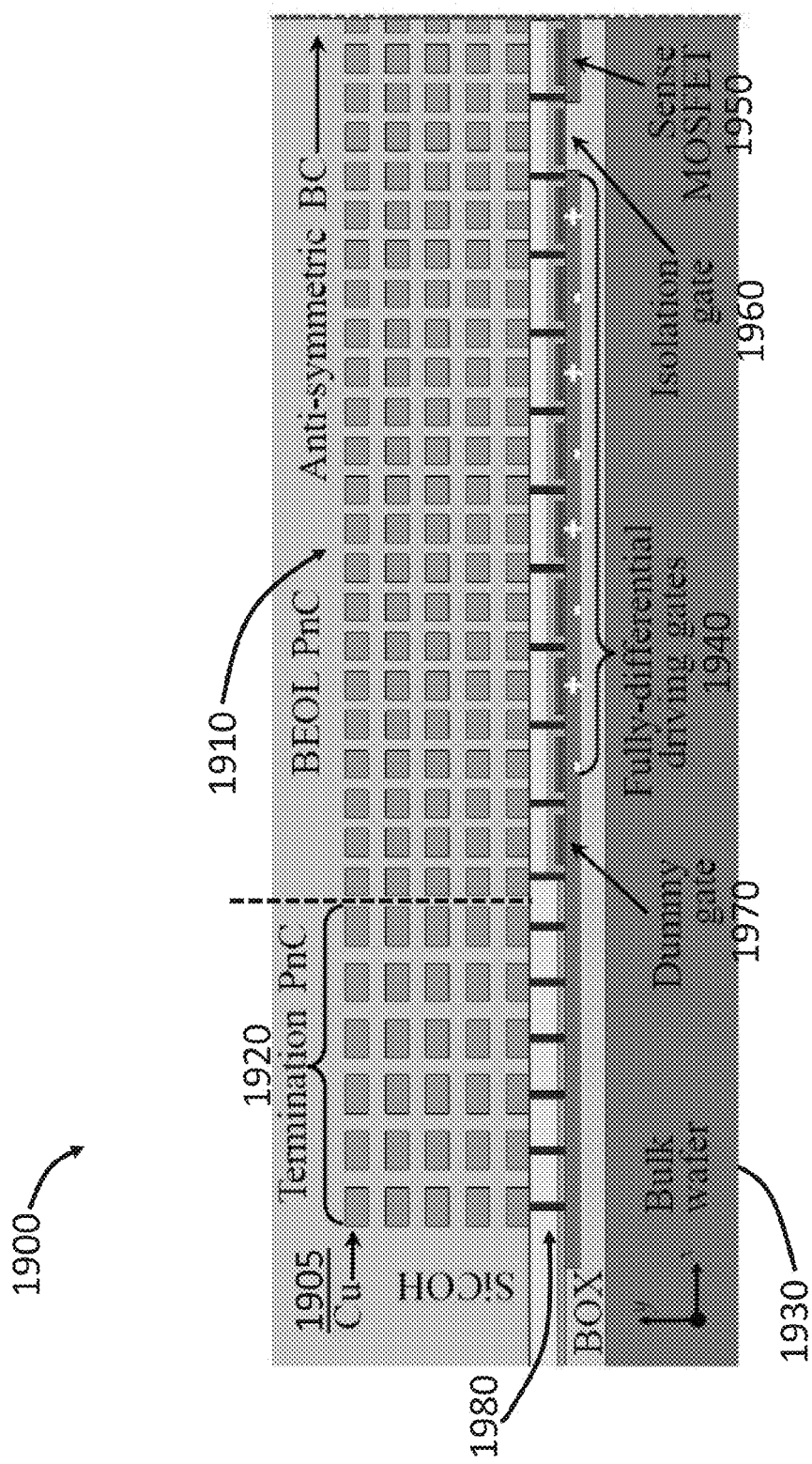
FIG. 19 shows a cross section of the left-half of an acoustic resonator including metal contacts in the terminal waveguide section.

FIG. 19 shows a cross section of the left half of an acoustic resonator 1900 (designated as RBT B) including metal contacts in the termination waveguide section. The acoustic resonator 1900 includes a first phononic crystal 1910 disposed on a wafer 1930 so as to define a main cavity. A termination phononic crystal 1920 is disposed on the side of the first phononic crystal 1910 to define a termination waveguide. The termination phononic crystal 1920 has a larger period compared to the first phononic crystal 1910. A filling material 1905 is disposed in the gaps between metal stripes in the phononic crystals 1910 and 1920.

The phononic crystal 1900 also includes an array of acoustic transducers 1940 (e.g., MOSCAPs) disposed between the first phononic crystal 1910 and the wafer 1930 so as to carry out fully differential driving. A sensing element 1950 (e.g., MOSFET) is also disposed between the first phononic crystal 1910 and the wafer 1930 to convert acoustic waves back into electrical signals. In addition, the acoustic resonator 1900 can further include an optional isolation gate 1960 disposed between the acoustic transducers 1940 and the sensing element 1950 for isolation.

The difference between the acoustic resonator 1600 shown in FIG. 16 and the acoustic resonator 1900 shown in FIG. 19 is that the acoustic resonator 1900 further includes metal contacts 1980 disposed between the termination phononic crystal 1920 and the wafer 1930. A dummy gate 1970 is disposed between the metal contacts 1980 and the acoustic transducers 1940.

Figure 20:
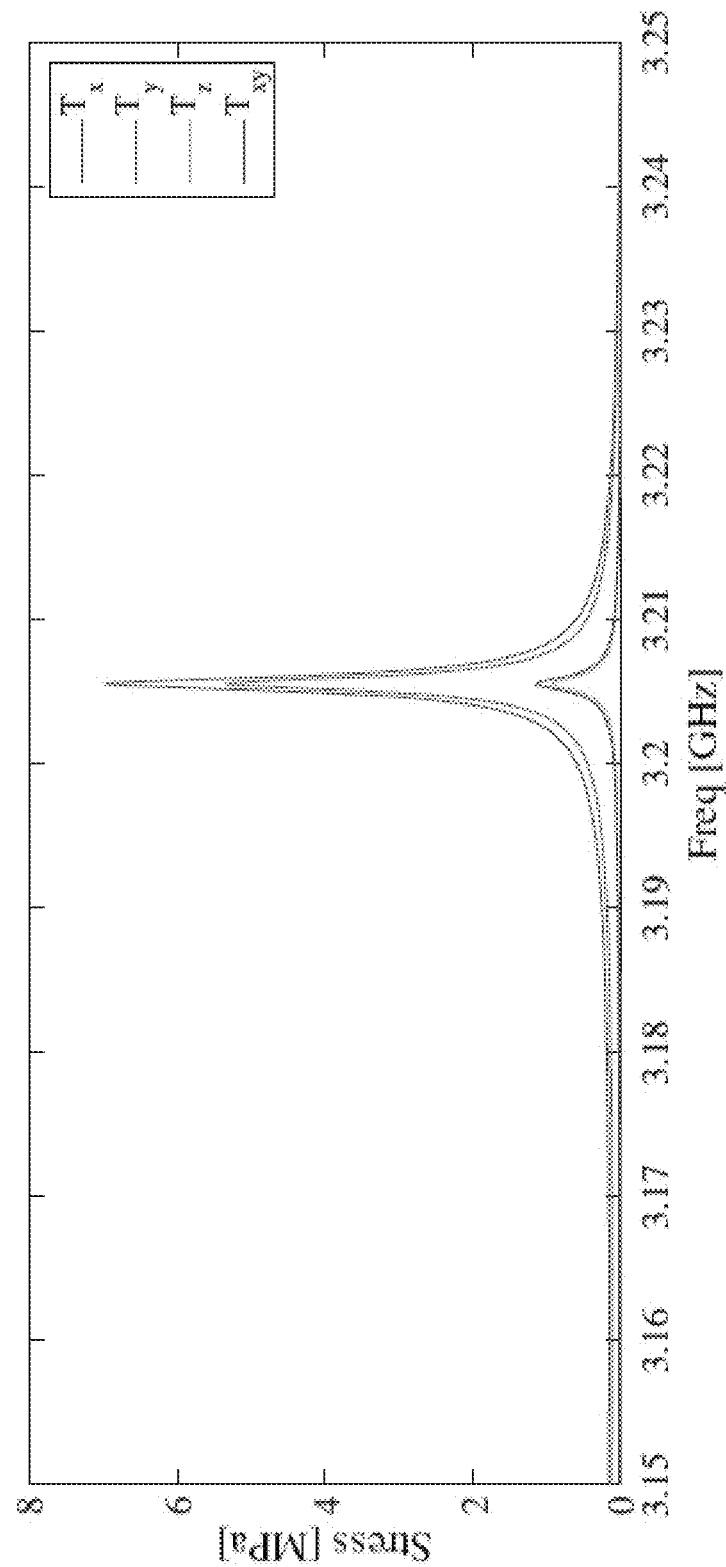
FIG. 20 shows FEM simulation results illustrating the average stresses at the sensing elements in the acoustic resonator shown in FIG. 19 with a resonance at 3.205 GHz.

FIG. 20 shows FEM simulation results illustrating the average stresses at the sensing elements in the acoustic resonator 1900 shown in FIG. 19 with a resonance at 3.205 GHz.

Figure 21:
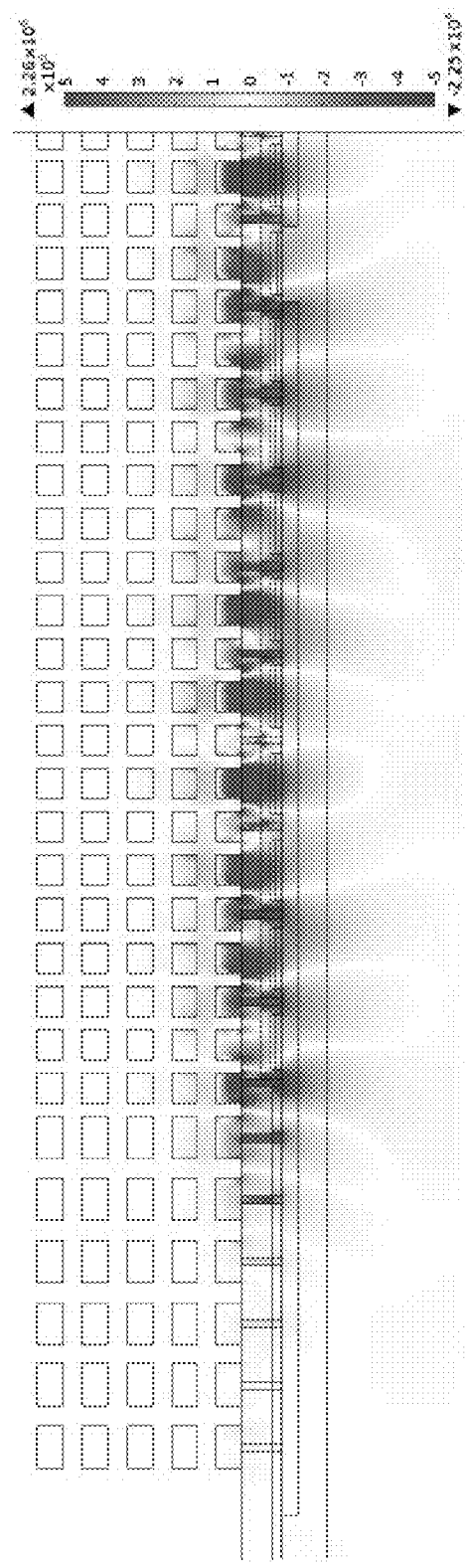
FIG. 21 shows FEM simulation illustrating the y-stress $T_{yy}$ for the acoustic resonator shown in FIG. 19 at the 3.205 GHz resonance mode.

FIG. 21 shows FEM simulation illustrating the y-stress $T_{yy}$ for the acoustic resonator 1900 shown in FIG. 19 at the 3.205 GHz resonance mode.

Full numerical optimization can be carried out for both RBT A shown in FIG. 16 and RBT B shown in FIG. 19. Maximizing the trans-conductance can be selected as the objective function for the optimization. Artificial isotropic material losses that exceed the physical intrinsic losses can be included in the FEM models. This can set a limit of 3,000 on the quality factor in simulation. Such a limit is intended to avoid generating spurious sharp resonances that can disrupt the optimization process. The optimization usually concludes with RBTs having a quality factor of 3,000, the artificial material losses limit. This indicates that radiation losses have been reduced to guarantee a quality factor of at least 3,000. A lower limit on the quality factor is usually a good specification for resonators for low-phase noise timing applications. The fabricated resonators are estimated to have higher quality factors.

The optimization parameters, along with the final design values, are listed in Table 2. FEM simulations are carried out with the optimized structures. The simulation assumes a 1 MPa $T_{yy}$ stress applied at the driving MOSCAPs with the proper sign to emulate fully differential driving. Quality factor was artificially limited in this simulation to 3,000. The average stresses at the sensing transistors for "RBT-B" are shown in FIG. 20, while the $T_{yy}$ stress at resonance is shown in FIG. 21.

TABLE 2

Dimensional parameters for "RBT-A" and "RBT-B" in nanometers

| Parameter | RBT-A | RBT-B | Description |
|---|---|---|---|
| $l_M$ | 154 | 154 | Length of the main cavity PnC metal stripes |
| $s_M$ | 66 | 66 | Separation of the main cavity PnC metal stripes |
| $l_{M-T}$ | 214 | 214 | Length of the termination PnC metal stripes |
| $s_{M-T}$ | 98 | 98 | Separation of the termination PnC metal stripes |
| $l_g$ | 314 | 314 | Length of the sensing transistor gate |
| $l_{iso}$ | 312 | 312 | Length of the isolation gate |

It is clear that the structure achieves almost perfect confinement, both in the vertical and horizontal directions, without significant scattering anywhere in the structure. This is a direct result of the full structural optimization that implicitly matched the characteristics of the different waveguides to achieve high Q.

Acoustic Resonators Transition Regions

Acoustic resonators based on phononic crystals can also include a transition region between the main cavity phononic crystal and the termination phononic crystals. The transition region can include metal strips arrayed with a period gradually changing from the period of the main cavity phononic crystal to the period of the termination phononic crystal.

Figure 22:
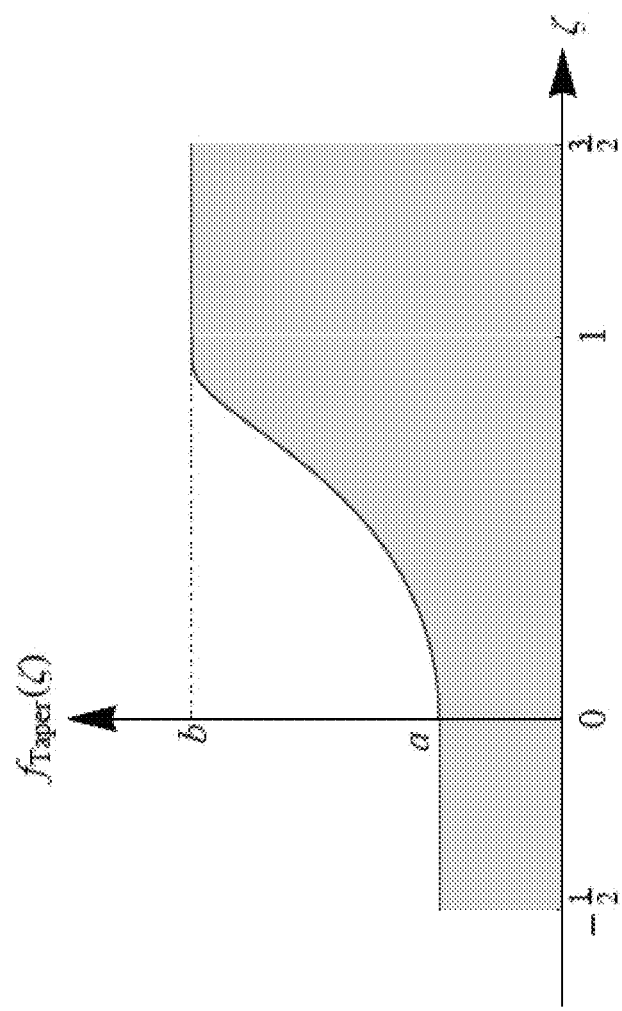
FIG. 22 shows a taper function used for the adiabatic termination in acoustic resonators.

FIG. 22 shows a taper function used for the adiabatic termination in acoustic resonators. As discussed above, adiabatic transition can be used for RBTs terminations.

Adiabatic transition can be used to reduce scattering at the interface between the main cavity and the termination waveguides.

A spatial taper function $\varphi(\zeta)$ that is infinitely differentiable can be given by:

$$\phi(\zeta) = e\exp\left(\frac{-1}{(2-\zeta)\zeta}\right), \forall \zeta \in [0, 1] \quad (10)$$

For a taper that starts at x=0 with a value a and ends at x=1 with a value b>a, the taper function $f_{Taper}(\zeta)$ takes the form:

$$f_{Taper}(\zeta) = b + (a-b)\varphi(1-\zeta), \forall \zeta \in [0,1] \quad (11)$$

This taper function is shown in FIG. 22. Since the waveguide is periodic with discrete translation symmetry, waveguide periods can be set to sample the taper function $f_{Taper}(\zeta)$ with equal $\zeta$ intervals.

Figure 23:
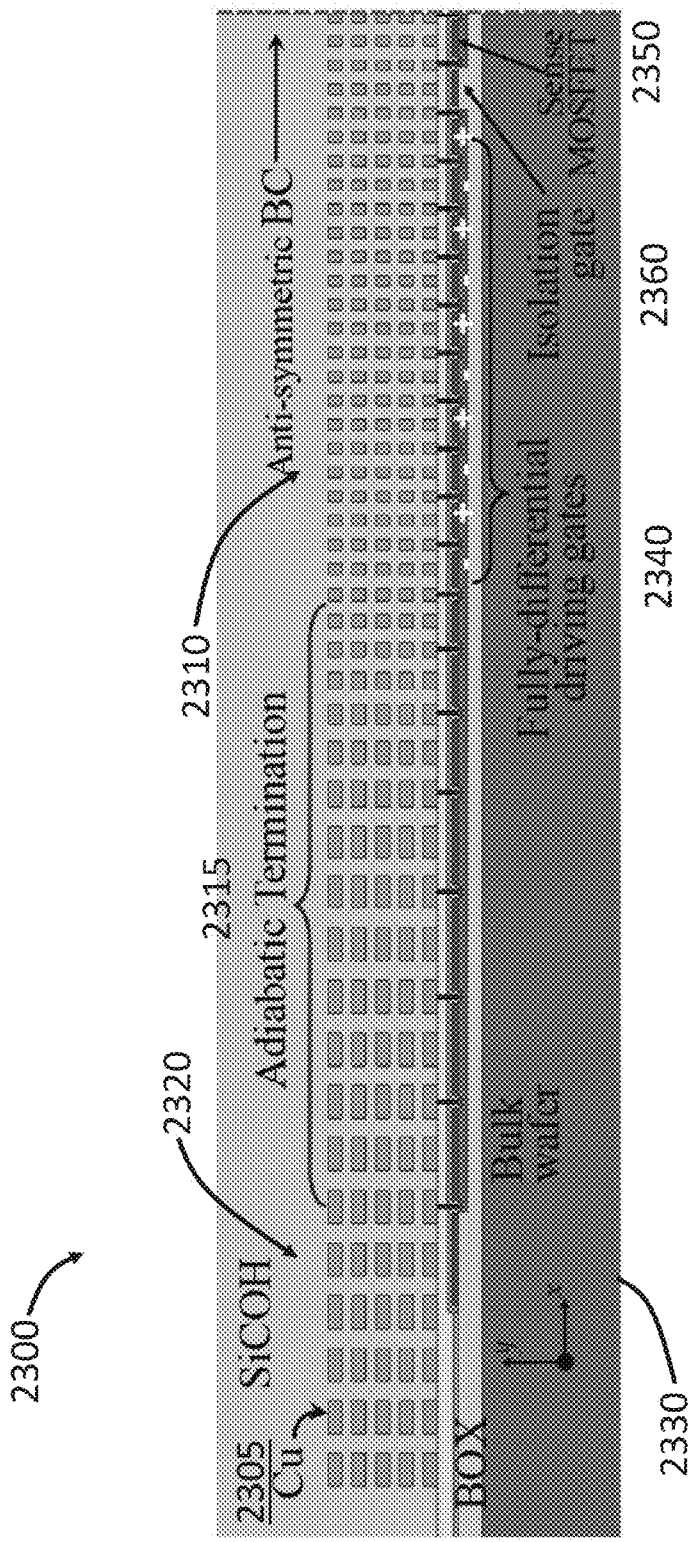
FIG. 23 shows a cross section of the left-half of an acoustic resonator including adiabatic transition regions.

FIG. 23 shows a cross section of the left-half of an acoustic resonator 2300 (designated as RBT C) including adiabatic transition regions. The acoustic resonator 2300 includes a first phononic crystal 2310 disposed on a wafer 2330 so as to define a main cavity. A termination phononic crystal 2320 is disposed on the side of the first phononic crystal 2310 to define a termination waveguide. The termination phononic crystal 2320 has a larger period compared to the first phononic crystal 2310. A filling material 1905 (e.g., SiCOH) is disposed in the gaps between metal stripes in the phononic crystals 2310 and 2320.

Between the first phononic crystal 2310 and the termination phononic crystal 2320 is an adiabatic transition region 2315 including 2D arrays of metal stripes. The period of the metal stripes in the adiabatic transition region 2315 changes progressively from the period of the first phononic crystal to the period of the termination phononic crystal 2320. In other words, the acoustic resonator 2300 includes a smooth transition of period from the first phononic crystal 2310 to the termination phononic crystal 2320 so as to reduce scattering when acoustic waves are reflected by the termination waveguide defined by the termination phononic crystal 2320 and the wafer 2330.

The phononic crystal 2300 also includes an array of acoustic transducers 2340 (e.g., MOSCAPs) disposed between the first phononic crystal 2310 and the wafer 2330 so as to carry out fully differential driving. A sensing element 2350 (e.g., MOSFET) is also disposed between the first phononic crystal 2310 and the wafer 2330 to convert acoustic waves back into electrical signals. In addition, the acoustic resonator 2300 can further include an optional isolation gate 2360 disposed between the acoustic transducers 2340 and the sensing element 2350 for isolation.

Figure 24:
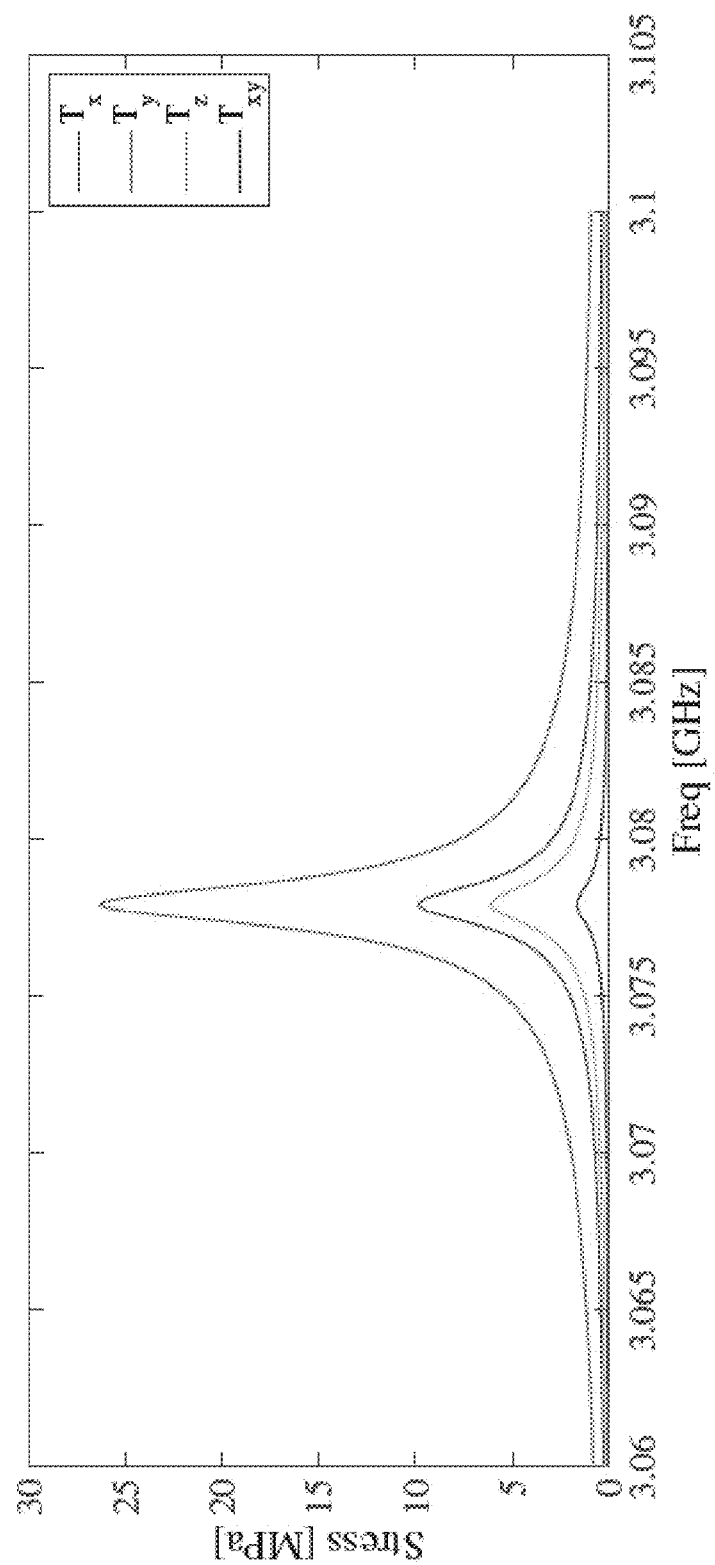
FIG. 24 shows FEM simulation results illustrating the average stresses at the sensing elements in the acoustic resonator shown in FIG. 23 with a resonance at 3.078 GHz.

FIG. 24 shows FEM simulation results illustrating the average stresses at the sensing elements in the acoustic resonator shown in FIG. 23 with a resonance at 3.078 GHz.

Figure 25:
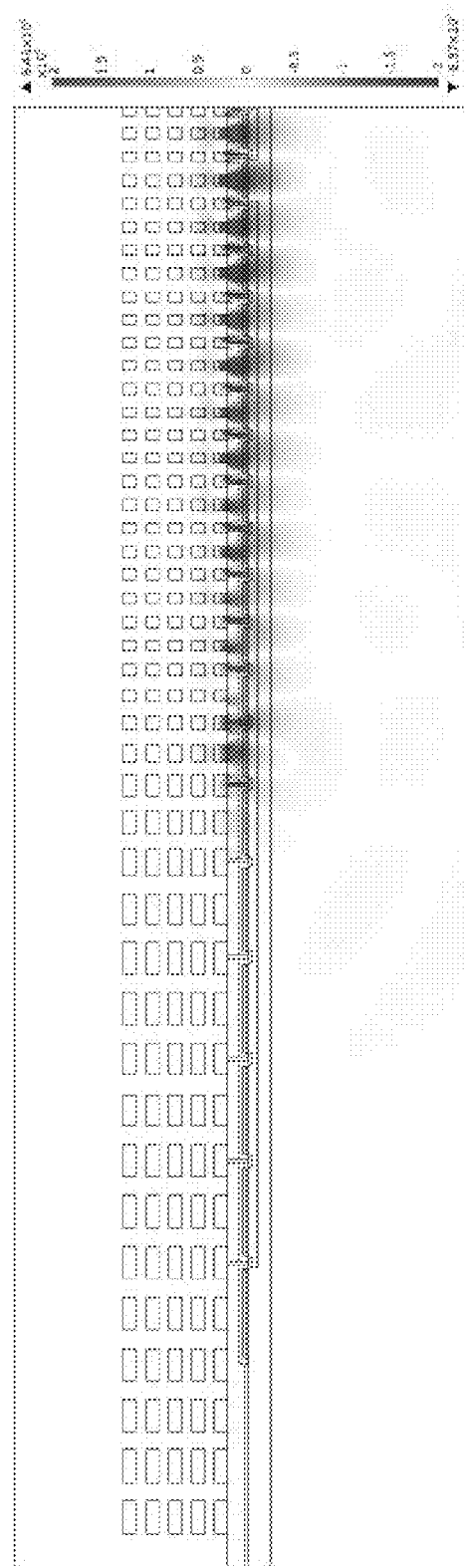
FIG. 25 shows FEM simulation illustrating the y-stress $T_{yy}$ for the acoustic resonator shown in FIG. 23 at the 3.078 GHz resonance mode.

FIG. 25 shows FEM simulation illustrating the y-stress $T_{yy}$ for the acoustic resonator shown in FIG. 23 at the 3.078 GHz resonance mode.

Five termination waveguide periods have been selected to implement adiabatic transition in the acoustic resonator 2300. Numerical optimization has been carried out for the RBT C with adiabatic transition. Frequency response of the RBT as well as the $T_{yy}$-stress at resonance is shown in FIG. 24 and FIG. 25, respectively. It is clear that the mode shows minimal scattering.

The RBT with adiabatic transition shows a quality factor of 2,450, whereas an RBT with the same dimensions but with abrupt termination shows a quality factor of 1,820. That is, FEM simulation estimates that the adiabatic transition for the termination lowers the scattering and enhances Q by 35%. It is also important to note that the mode in FIG. 25 is uniformly distributed among the driving and sensing. This becomes especially obvious when compared to the modes of FIGS. 18 and 21. Thus, although the Q is not higher (due to the particular dimensions chosen for this design), the mode is quite uniform and results in efficient driving and sensing. This is directly evident by considering the stresses in FIG. 20, which are much higher than those of "RBT-A" and "RBT-B," even though the overall Q is lower.

Experimental Characterization of Acoustic Resonators

Figures 26A, 26B, 26C:
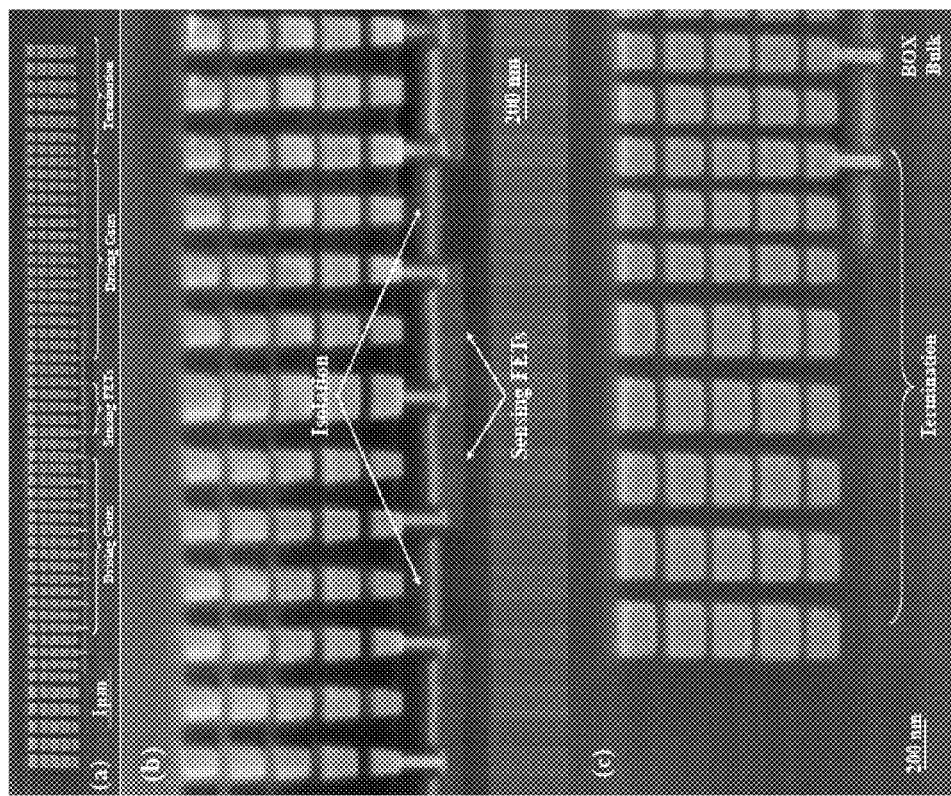
FIGS. 26A-26C are SEM micrographs of the full resonator structure, the sensing transistors gate, and the termination waveguide, respectively, of the acoustic resonator illustrated in FIG. 16.

FIGS. 26A-26C are SEM micrographs for "RBT-A" showing the full RBT structure, the sensing transistors gate, and the termination PnC waveguide, respectively.

Figure 27A:
FIGS. 27A-27C are SEM micrographs of the full resonator structure, the sensing transistors gate, and the termination waveguide, respectively, of the acoustic resonator illustrated in FIG. 19.
Figure 27B:
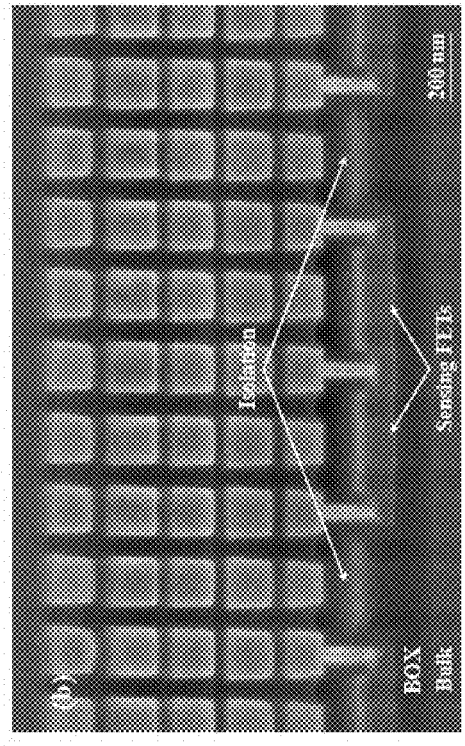
Figure 27C:
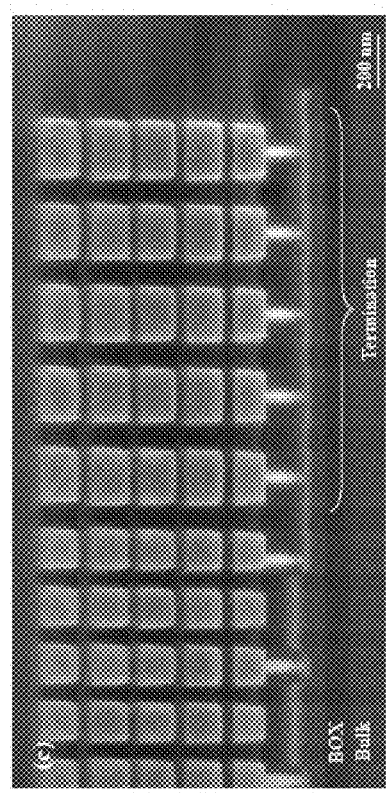

FIGS. 27A-26C are SEM micrographs for "RBT-B" showing the full RBT structure, the sensing transistors gate, and the termination PnC waveguide, respectively.

The SEM micrographs clearly show the fully differential sensing transistors in their isolated active area. The termination waveguides are also clearly highlighted for both devices. Both RBTs occupy an area of 13.5 μm×4.7 μm, including the fully differential driving gates routing. The width of the sensing transistors and the driving MOSCAPs is 3 μm. A fill-exclude window has been included on all layers in the resonator area to avoid any interaction with the random CMP fill.

The devices shown in FIGS. 26A-27C incorporate the regular square CMOS contacts to the active area. Devices with rectangular wall-like vias with the same dimensions have also been fabricated in the same silicon run. The rectangular vias in this IBM run may have large voids and may compromise the mechanical performance of the rectangular contacts RBTs. The major problem with these voids is that they may result in random contact shape and density. This in turn can result in large scattering, thereby reducing the quality factor of the resonator to the point where the output signal may not be discerned from the noise floor.

Figures 28A, 28B, 28C:
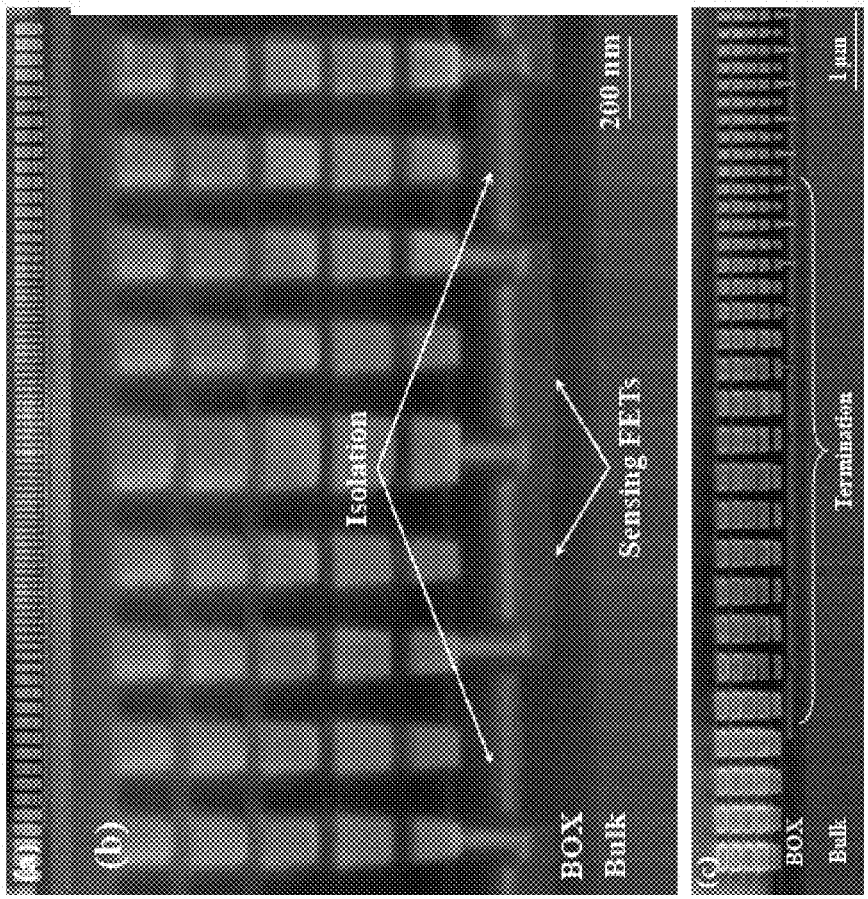
FIGS. 28A-28C are SEM micrographs of the full resonator structure, the sensing transistors gate, and the termination waveguide, respectively, of the acoustic resonator illustrated in FIG. 23.

FIGS. 28A-28C are SEM micrographs for "RBT-C" showing the full RBT structure, the sensing transistors gate, and the termination PnC waveguide, respectively. RBTs with adiabatic transition have also been fabricated in IBM 32 nm SOI. A cross-section of "RBT-C" is shown in FIGS. 28A-28C. The cross-section highlights the sensing transistors as well as the termination waveguide with adiabatic taper. This implementation makes use of the CMOS regular square contacts as opposed to rectangular vias. Some contacts might appear to be missing in FIGS. 28A-28C, but this is mainly due to a small tilt in the horizontal direction in the FIB process.

The implemented RBT occupies an area of 28 μm×5 μm, including the fully differential driving gates routing. The resonant RBT cavity itself is 28 μm×3 μm, the width of the sensing transistors and all MOSCAPs is 3 μm. Fill-exclude rectangles have been included on all layers to avoid any mechanical interaction with the random CMP fill.

Figure 29:
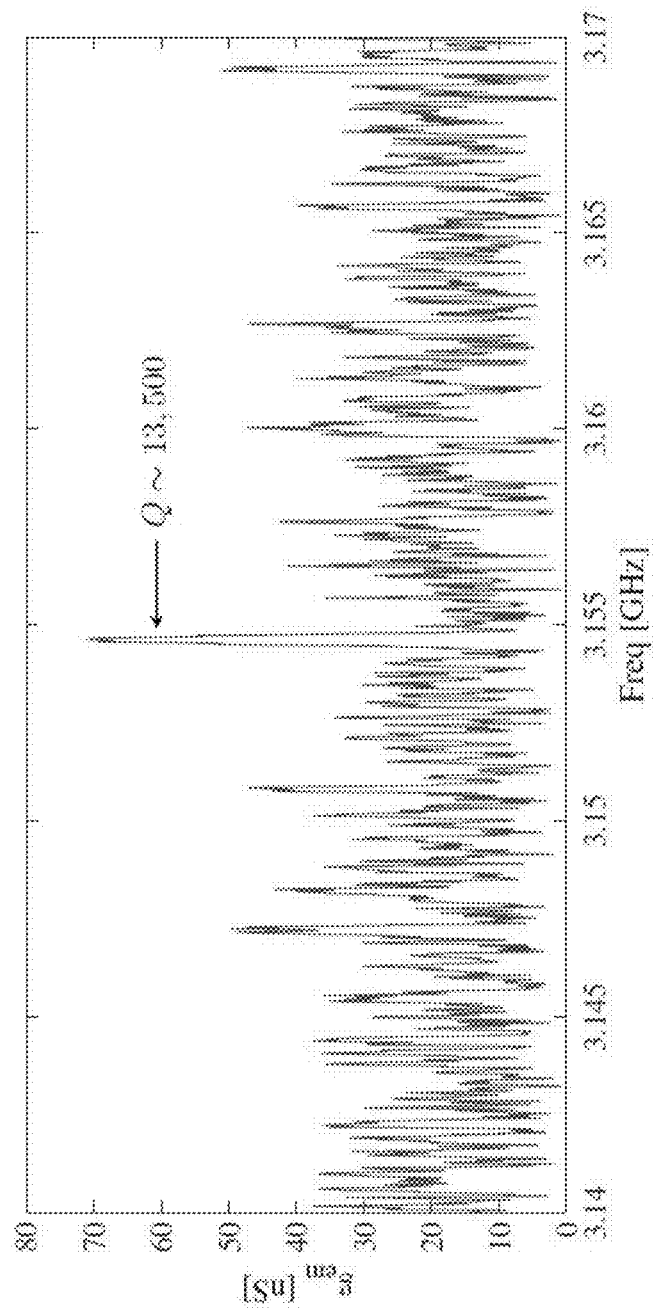
FIG. 29 shows measurement results of fully differential electromechanical trans-conductance in the acoustic resonator shown in FIG. 16.

FIG. 29 shows measurement results of fully differential RBT electromechanical transconductance $g_{em}$ for "RBT-A" (illustrated in FIG. 16), showing a resonance peak at 3.155 GHz with Q~13,500 for $f_0 \cdot Q$~4.28×10$^{13}$.

Figure 30:
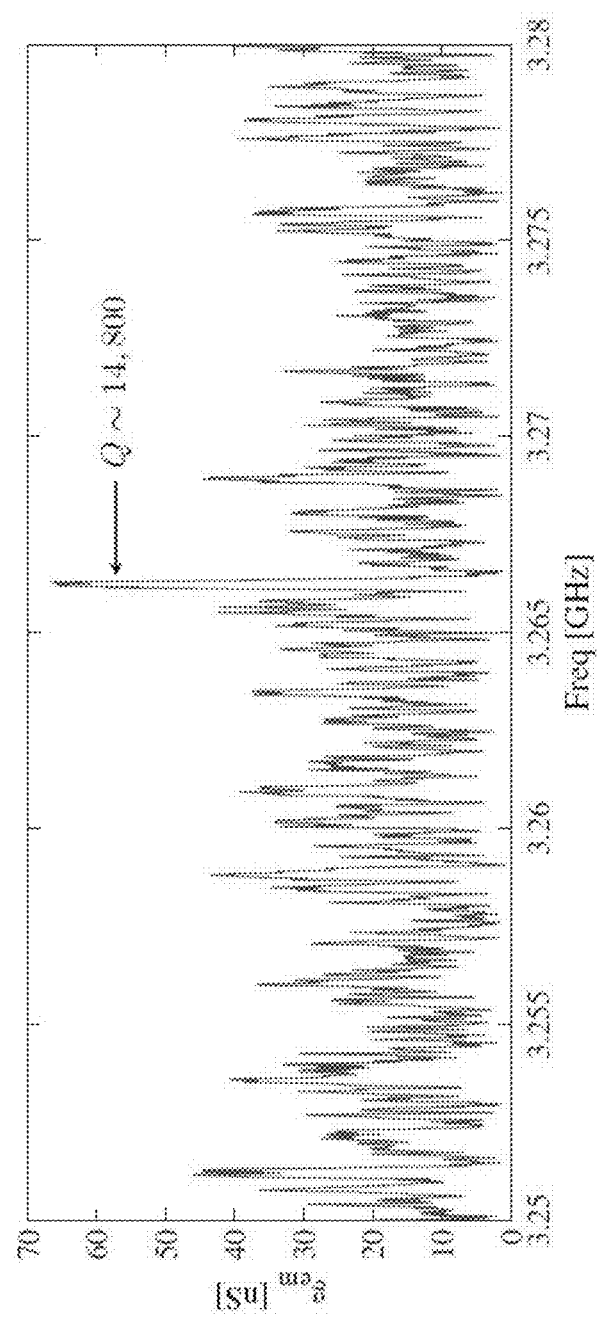
FIG. 30 shows measurement results of fully differential electromechanical trans-conductance in the acoustic resonator shown in FIG. 19.

FIG. 30 shows measurement results showing fully differential $g_{em}$ for "RBT-B" (illustrated in FIG. 19), showing a resonance peak at 3.26 GHz with Q~14,800 for $f_0 \cdot Q$~4.85×10$^{13}$.

Figure 31:
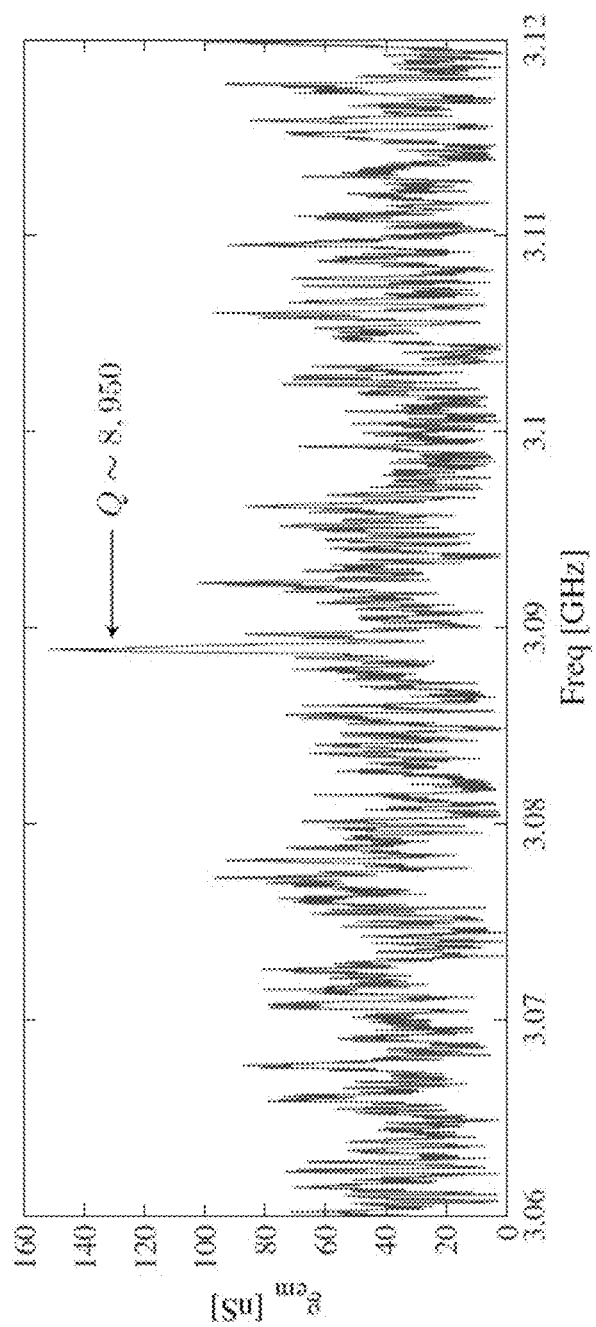
FIG. 31 shows measurement results of fully differential electromechanical trans-conductance in the acoustic resonator shown in FIG. 23.

FIG. 31 shows measurement results showing fully differential $g_{em}$ for "RBT-C" (illustrated in FIG. 23), showing a resonance peak at 3.089 GHz with Q~8,950 for $f_0 \cdot Q \sim 2.77 \times 10^{13}$.

The RBT A measured gem is shown in FIG. 29. The device $g_{em}$ with 0 V driving DC bias is considered to be the open structure and is de-embedded from $g_{em}$ at 1 V. This de-embedding is more accurate, as a large component of the feed-through is subtracted from the device response. Short de-embedding was found to have a negligible effect on the response. The measured $g_{em}$ shows a resonance peak at 3.155 GHz that closely matches FEM simulation predictions. The quality factor is found to be Q~13,500 for an $f_o \cdot Q \sim 4.28 \times 10^{13}$. 11-point smoothing was used for this measurement.

RBT B has undergone similar measurements and de-embedding. The measured $g_{em}$ is shown in FIG. 30, where 13-point smoothing has been used. The RBT B resonance frequency was found to be 3.265 GHz, closely matching FEM simulation. Quality factor Q~14, 800 is estimated from measurements for an $f_o \cdot Q \sim 4.85 \times 10^{13}$. RBT-B shows significant improvement (about 58 times) in quality factor and in $f_o \cdot Q$ (about 68 times) over existing resonators. This improvement clearly indicates that the quality factor and $f_o \cdot Q$ were not limited by material-intrinsic losses.

RBT C with adiabatic transition measured gem is shown in FIG. 31. A resonance frequency of 3.089 GHz is observed, closely matching FEM simulations, whereas Q~8,950 for $f_o \sim Q \sim 2.77 \times 10^{13}$. As predicted from FEM simulations, RBT C shows higher $g_{em}$ than RBT-A and RBT-B due to the uniformity and stress distribution of the mode. New transduction physics (such as piezoelectric transduction by ferroelectric materials) may be helpful to further boost the RBTs $g_{em}$.

CONCLUSION

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Various inventive concepts may be embodied as one or more methods, of which examples have been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e., "one or the other but not both") when preceded by terms of exclusivity, such as "either," "one of," "only one of," or "exactly one of" "Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. An apparatus for confining an acoustic wave, the apparatus comprising:
    a wafer;
    a first phononic crystal disposed on the wafer, the first phononic crystal and the wafer defining an acoustic waveguide to propagate the acoustic wave along a propagation direction, the first phononic crystal comprising a first two-dimensional (2D) array of metal stripes having a first period along the propagation direction;
    a second phononic crystal disposed on a first side of the first phononic crystal, the second phononic crystal comprising a second 2D array of metal stripes having a second period, different than the first period, along the propagation direction, the second phononic crystal and the wafer defining a first reflector to reflect the acoustic wave; and
    a third phononic crystal disposed on a second side, opposite the first side, of the first phononic crystal, the third phononic crystal comprising a third 2D array of metal stripes having a third period, different than the first period, along the propagation direction, the third phononic crystal and the wafer defining a second reflector to reflect the acoustic wave,
    wherein the second period is different than the third period.

2. The apparatus of claim 1, wherein the wafer comprises silicon.

3. The apparatus of claim 1, wherein the first 2D array of metal stripes comprises at least one of copper or tungsten.

4. The apparatus of claim 1, wherein the first period is about 10 nm to about 1 μm.

5. An apparatus for confining an acoustic wave, the apparatus comprising:
    a wafer;
    a first phononic crystal disposed on the wafer, the first phononic crystal and the wafer defining an acoustic waveguide to propagate the acoustic wave along a propagation direction, the first phononic crystal comprising a first two-dimensional (2D) array of metal stripes having a first period along the propagation direction;
    a second phononic crystal disposed on a first side of the first phononic crystal, the second phononic crystal comprising a second 2D array of metal stripes having a second period, different than the first period, along the propagation direction, the second phononic crystal and the wafer defining a first reflector to reflect the acoustic wave; and
    a third phononic crystal disposed on a second side, opposite the first side, of the first phononic crystal, the third phononic crystal comprising a third 2D array of metal stripes having a third period, different than the first period, along the propagation direction, the third phononic crystal and the wafer defining a second reflector to reflect the acoustic wave,
    wherein the second period is more than 10% greater than the first period.

6. The apparatus of claim 1, wherein the second period is substantially equal to the third period.

7. The apparatus of claim 1, further comprising:
    at least one acoustic transducer, disposed between the first phononic crystal and the wafer, to convert an electrical signal into the acoustic wave.

8. The apparatus of claim 7, wherein the at least one acoustic transducer comprises at least one field-effect transistor (FET).

9. The apparatus of claim 7, wherein the at least one acoustic transducer comprises an array of acoustic transducers, having a transducer period substantially equal to the first period, disposed along the propagation direction, wherein adjacent acoustic transducers in the array of acoustic transducers are configured to generate acoustic signals having opposite phases.

10. The apparatus of claim 1, further comprising:
    a sensing transducer, disposed between the first phononic crystal and the wafer, to convert the acoustic wave into at least one electrical signal.

11. The apparatus of claim 10, wherein the sensing transducer comprises an FET.

12. The apparatus of claim 1, further comprising:
    a fourth array of 2D metal stripes disposed between the first 2D array of metal stripes and the second 2D array of metal stripe, at least one spacing between adjacent metal stripes in the fourth array of metal stripes is greater than the first period and less than the second period.

13. The apparatus of claim 1, further comprising:
    a fourth array of 2D metal stripes disposed between the first 2D array of metal stripes and the second 2D array of metal stripes, wherein respective spacings between adjacent metal stripes change progressively from the first period to the second period along the propagation direction.

14. A method of confining an acoustic wave, the method comprising:
    guiding the acoustic wave along a propagation direction in a waveguide defined by a wafer and a first phononic crystal disposed on the wafer, the first phononic crystal comprising a first two-dimensional (2D) array of metal stripes having a first period along the propagation direction;
    reflecting the acoustic wave by a first reflector defined by the wafer and a second phononic crystal disposed on a first side of the first phononic crystal, the second phononic crystal comprising a second 2D array of metal stripes having a second period, different than the first period, along the propagation direction; and
    reflecting the acoustic by a second reflector defined by the wafer and a third phononic crystal disposed on a second side, opposite the first side, of the first photonic crystal, the third phononic crystal comprising a third 2D array of metal stripes having a third period, different than the first period, along the propagation direction; and
    generating the acoustic wave using an array of acoustic transducers, having a transducer period substantially equal to the first period, disposed along the propagation direction, wherein adjacent acoustic transducers in the array of acoustic transducers are configured to generate acoustic signals having opposite phases.

15. The method of claim 14, wherein generating the acoustic wave comprises generating the acoustic wave using at least one field-effect transistor (FET) disposed between the first photonic crystal and the wafer.

16. The method of claim 14, wherein generating the acoustic wave comprises generating the acoustic wave having a wave vector along the propagation direction $k_x$ substantially equal to $\pi/a$, where a is the first period of the first 2D array of metal stripes.

17. The method of claim 14, further comprising:
converting the acoustic wave into at least one electrical signal using a sensing transducer, disposed between the first phononic crystal and the wafer.

18. The method of claim 17, wherein converting the acoustic wave comprises transmitting the acoustic wave into an FET.

19. The method of claim 14, further comprising:
propagating the acoustic wave through a transition region defined by the wafer and a fourth array of 2D metal stripes disposed between the first 2D array of metal stripes and the second 2D array of metal stripes so as to reduce scattering of the acoustic wave, at least one spacing between adjacent metal stripes in the fourth array of metal stripes is greater than the first period and less than the second period.

20. The method of claim 14, further comprising:
propagating the acoustic wave through a transition region defined by the wafer and a fourth array of 2D metal stripes disposed between the first 2D array of metal stripes and the second 2D array of metal stripes so as to reduce scattering of the acoustic wave, wherein spacing between adjacent metal stripes changes progressively from the first period to the second period along the propagation direction.

21. An acoustic resonator comprising:
a silicon wafer;
a first phononic crystal disposed on the silicon wafer, the first phononic crystal and the wafer defining an acoustic waveguide to propagate the acoustic wave along a propagation direction, the first phononic crystal comprising a first two-dimensional (2D) array of metal stripes having a first period along the propagation direction;
a second phononic crystal disposed on a first side of the first phononic crystal, the second phononic crystal comprising a second 2D array of metal stripes having a second period, different than the first period, along the propagation direction, the second phononic crystal and the silicon wafer defining a first reflector to reflect the acoustic wave;
a first transition region disposed between the first 2D array of metal stripes and the second 2D array of metal stripes, wherein respective first spacings between adjacent metal stripes in the first transition region change progressively from the first period to the second period along the propagation direction;
a third phononic crystal disposed on a second side, opposite the first side, of the first phononic crystal, the third phononic crystal comprising a third 2D array of metal stripes having a third period, different than the first period, along the propagation direction, the third phononic crystal and the wafer defining a second reflector to reflect the acoustic wave;
a second transition region disposed between the first 2D array of metal stripes and the third 2D array of metal stripes, wherein respective second spacings between the adjacent metal stripes in the second transition region changes progressively from the first period to the third period along the propagation direction; and
an array of field effect transistors (FETs), disposed between the first photonic crystal and the silicon wafer and having a FET period substantially equal to the first period, to generate the acoustic wave, wherein adjacent FETs in the array of FETs are configured to generate acoustic signals having opposite phases.

22. The acoustic resonator of claim 21, further comprising:
at least one metal-oxide-semiconductor field-effect transistor (MOSFET), disposed between the first phononic crystal and the silicon wafer, to convert the acoustic wave into at least one electrical signal.

* * * * *